(12) United States Patent
Viswanathan Pillai et al.

(10) Patent No.: US 11,474,151 B2
(45) Date of Patent: Oct. 18, 2022

(54) LOCKSTEP COMPARATORS AND RELATED METHODS

(71) Applicant: Texas Instruments Incorporated, Dallas, TX (US)

(72) Inventors: Prasanth Viswanathan Pillai, Bangalore (IN); Rajeev Suvarna, Bangalore (IN); Saya Goud Langadi, Bangalore (IN); Shailesh Ganapat Ghotgalkar, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 121 days.

(21) Appl. No.: 17/138,529

(22) Filed: Dec. 30, 2020

(65) Prior Publication Data

US 2022/0206065 A1 Jun. 30, 2022

(51) Int. Cl.
*H03K 3/00* (2006.01)
*G01R 31/3177* (2006.01)
*H03K 5/24* (2006.01)
*H03K 19/003* (2006.01)
*H03K 3/037* (2006.01)

(52) U.S. Cl.
CPC ......... *G01R 31/3177* (2013.01); *H03K 3/037* (2013.01); *H03K 5/24* (2013.01); *H03K 19/003* (2013.01)

(58) Field of Classification Search
None
See application file for complete search history.

(56) References Cited

U.S. PATENT DOCUMENTS

| | | | |
|---|---|---|---|
| 7,051,252 B2 | 5/2006 | Smith et al. | |
| 8,843,093 B2 | 9/2014 | De Vita et al. | |
| 9,071,476 B2 | 6/2015 | Fox et al. | |
| 2006/0107154 A1 | 5/2006 | Bansal et al. | |
| 2009/0122852 A1* | 5/2009 | Smith | H04L 1/205 375/228 |
| 2020/0394147 A1* | 12/2020 | Taki | G06F 21/74 |
| 2021/0022345 A1* | 1/2021 | Winter | A61K 8/733 |
| 2021/0279124 A1* | 9/2021 | Meriac | G06F 11/1695 |

OTHER PUBLICATIONS

International Search Report for PCT/US2021/065609 dated Apr. 14, 2022.

* cited by examiner

*Primary Examiner* — Tuan T Lam
(74) *Attorney, Agent, or Firm* — Krista Y. Chan; Charles A. Brill; Frank D. Cimino

(57) ABSTRACT

Lockstep comparators and related methods are described. An example apparatus includes self-test logic circuitry having first outputs, and comparator logic including selection logic having first inputs and second outputs, ones of the first inputs coupled to the first outputs, first detection logic having second inputs and third outputs, the second inputs coupled to the second outputs, second detection logic having third inputs and fourth outputs, the third inputs coupled to the third outputs, latch logic having fifth inputs and fifth outputs, the third output and the fourth output coupled to the fifth inputs, and error detection logic having sixth inputs coupled to the fifth inputs.

25 Claims, 9 Drawing Sheets

LOCKSTEP COMPARATORS AND RELATED METHODS

FIELD OF THE DISCLOSURE

This disclosure relates generally to circuits and, more particularly, to lockstep comparators and related methods.

BACKGROUND

Safety protocols are used to ensure safety in electrical and/or electronic systems. For example, International Organization for Standardization (ISO) 26262 is an international standard for functional safety of electrical and/or electronic systems in automobiles. Such safety protocols analyze risk (e.g., the combination of the frequency of occurrence of harm and the severity of that harm) associated with electronic failures. Failures corresponding to electronics may be random or systematic. Random failures typically correspond to hardware related permanent or transient failures due to a system component loss of functionality. Systematic failures typically correspond to design faults, incorrect specifications, and/or not fit for purpose errors in software. Such safety protocols may analyze the electrical risks associated with a hardware processor that may process a signal to improve vehicle safety.

DETAILED DESCRIPTION

Figure 1:
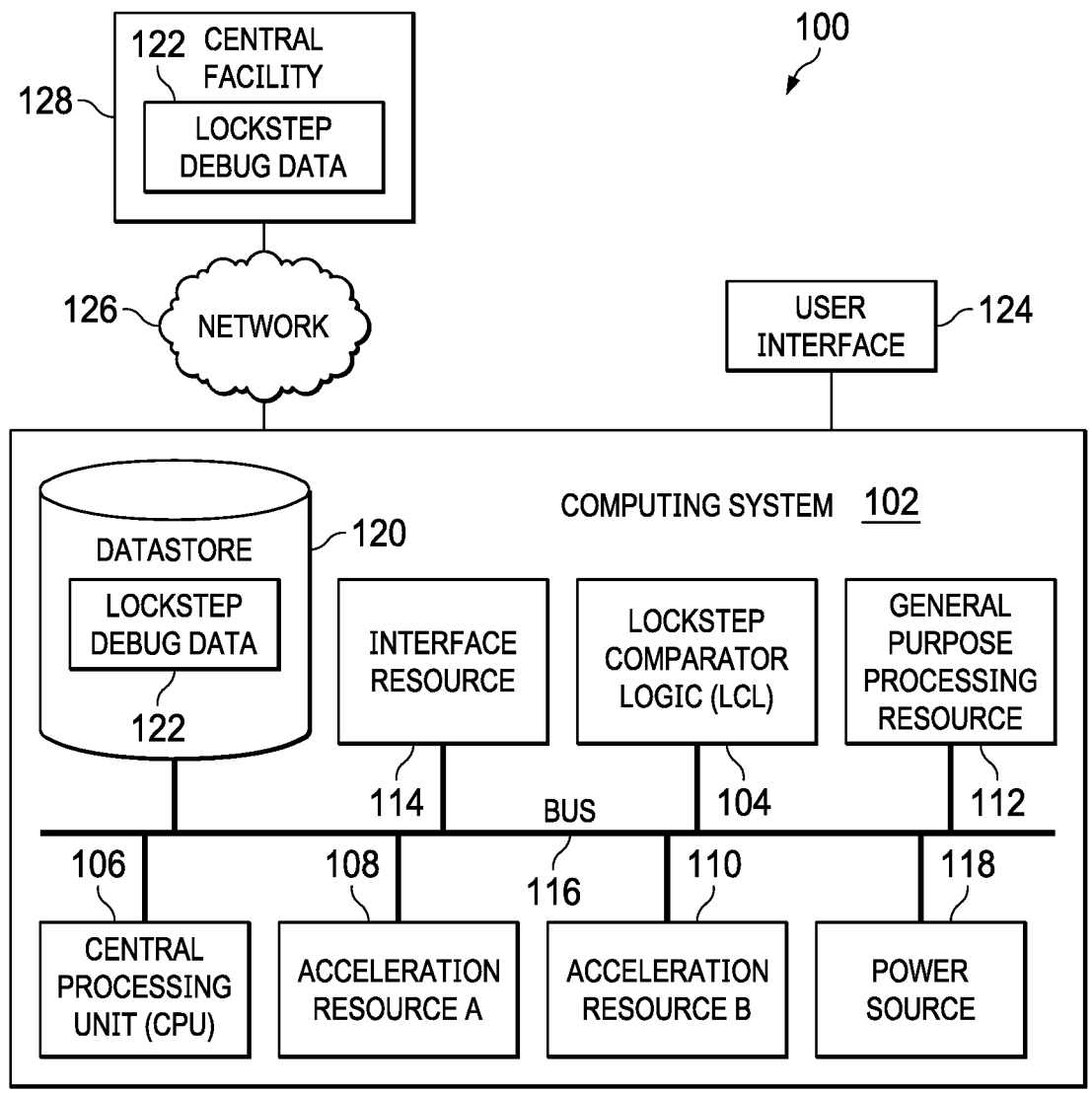
FIG. 1 is an illustration of an example system-on-a-chip (SoC) including example lockstep comparator circuitry to improve reliability and safety associated with an example hardware processor of the SoC.

The figures are not to scale. In general, the same reference numbers will be used throughout the drawing(s) and accompanying written description to refer to the same or like parts. As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third". In such instances, it should be understood that such descriptors are used merely for identifying those elements distinctly that might, for example, otherwise share a same name. As used herein "substantially real time" refers to occurrence in a near instantaneous manner recognizing there may be real world delays for computing time, transmission, etc. Thus, unless otherwise specified, "substantially parallel" and "substantially real time" refer to real time+/−1 second.

The complexity of computing and/or electrical devices has increased significantly with advances in technology. Such devices include hardware, software, and/or firmware to perform particular function(s). If an error occurs in the hardware, software, and/or firmware, such devices may not perform the particular function(s) or may execute the particular function(s) with poor performance. Such inability to perform and/or poor execution performance may affect the results of a related system and/or, more generally, the reliability and/or safety associated with operation of the related system. To detect and/or correct these errors, a device may include functional safety hardware. For example, an autopilot computing device, which may facilitate execution of autonomous operations of a vehicle (e.g., an air-based vehicle, a land-based vehicle, etc.), may include hardware that fulfills and/or otherwise satisfies requirements for functional safety. Functional safety requirements may be based on International Standards Organization (ISO) 26262, International Electrotechnical Commission (IEC) 61508, etc. ISO 26262 is an international standard for functional safety of electrical and/or electronic systems in production automobiles. IEC 61508 is an international standard corresponding to applying, designing, deploying, and maintaining automatic protection of safety-related systems.

Some applications utilize system-on-a-chip (SoC) hardware to carry out computing tasks. Some such SoC hardware include lockstep hardware, such as a lockstep processor or central processing unit (CPU), to facilitate compliance with functional safety requirements. For example, a "lockstep CPU," "lockstep processor," "lockstep hardware," or the like may refer to a multi-core compute hardware resource in which two or more cores of the multi-core compute hardware resource perform similar operations in parallel and each feed their respective outputs into a respective block of comparator logic to determine whether the outputs are equal. For example, the blocks of comparator logic may detect a fault condition associated with the multi-core compute hardware resource in response to determining that one(s) of the outputs from the two or more cores are not equal.

In some instances, functional safety standards mandate a requirement to execute a diagnostic of and/or otherwise test the lockstep capability, functionality, etc., of the lockstep hardware. However, prior lockstep testing implementations are intrusive to the application because they may make the lockstep hardware unavailable to execute code with the same integrity during the test of the lockstep functionality as compared to normal operation outside of the test. Alternatively, to facilitate online test sequencing, some prior lockstep testing implementations utilize dual comparators. However, these dual comparators may not be operated in lockstep (e.g., configured to be operated in lockstep) with each other and do not provide lockstep test functionality as disclosed herein.

Some prior lockstep testing implementations are significantly slow to complete. For example, in some prior lockstep testing implementations, it may require 2*N cycles for lockstep hardware to compare N signals. In some such examples, a single lockstep comparator may be utilized, which may result in the significantly long self-test sequences. Some prior lockstep testing implementations may also not have the ability to isolate fault conditions of lockstep hardware such as failures associated with lockstep comparators. Such isolation of fault conditions may provide benefits such as increased granularity of debugging information, which may be used to improve operation of current or future lockstep hardware.

Examples described herein include lockstep comparators and related methods. In some described examples, the lockstep comparators output diagnostic data during online operation of lockstep hardware, which may facilitate improved offline failure analysis associated with detected fault conditions of the lockstep hardware. In some described examples, the lockstep comparators include two or more lockstep comparators that may implement online test sequencing. For example, the lockstep comparators may test lockstep functionality while the lockstep hardware is online and/or otherwise executing application code. Advantageously, the lockstep comparators as described herein may test the lockstep functionality of the lockstep hardware without taking the lockstep hardware offline by replacing relatively long test sequences in prior implementations with redundancy logic. For example, lockstep comparators as described herein may complete a diagnostic test of the lockstep hardware in 8 clock cycles compared to thousands of clock cycles in some prior lockstep testing implementations. Advantageously, the example lockstep comparators as described herein may provide comprehensive debug information (e.g., fault condition data, port information (e.g., port-mismatch values), etc.) to external hardware, software, and/or firmware, such as a computing device, a user interface associated with the computing device, etc.

FIG. 1 is an illustration of an example computing environment 100 including an example computing system 102 including example lockstep comparator logic (LCL) 104 to identify diagnostics of and/or otherwise effectuating testing of lockstep capabilities, functionality, etc., of lockstep hardware. For example, the LCL 104 may compare outputs from one or more cores, modules, etc., of lockstep hardware and identify a fault condition based on the comparison of the outputs.

The computing system 102 includes an example central processing unit (CPU) 106, a first example acceleration resource (ACCELERATION RESOURCE A) 108, a second example acceleration resource (ACCELERATION RESOURCE B) 110, an example general purpose processing resource 112, an example interface resource 114, an example bus 116, an example power source 118, and an example datastore 120. In this example, the datastore 120 stores and/or otherwise includes example lockstep debug data 122. Further depicted in the illustrated example of FIG. 1 is an example user interface 124, an example network 126, and an example central facility 128, which may store the lockstep debug data 122.

In some examples, the computing system 102 is a system-on-a-chip (SoC) representative of one or more integrated circuits (ICs) (e.g., compact ICs) that incorporate components of a computer or other electronic system in a compact format. For example, the computing system 102 may be implemented with a combination of one or more programmable processors, hardware logic, and/or hardware peripherals and/or interfaces. Additionally or alternatively, the example computing system 102 of FIG. 1 may include memory, input/output (I/O) port(s), and/or secondary storage. For example, the computing system 102 includes the LCL 104, the CPU 106, the first acceleration resource 108, the second acceleration resource 110, the general purpose processing resource 112, the interface resource 114, the bus 116, the power source 118, the datastore 120, the memory, the I/O port(s), and/or the secondary storage all on the same substrate. In some examples, the computing system 102 includes digital, analog, mixed-signal, radio frequency (RF), or other signal processing functions.

In some examples, the computing system 102 implements an electronic control unit (ECU) in a vehicle (e.g., a driver operated vehicle, an autonomous vehicle, etc.). For example, the computing system 102 may be an ECU that controls one or more components, functions, etc., of a vehicle. In some examples, the computing system 102 may be an ECU that controls an engine (e.g., a combustion engine), a motor (e.g., an electric motor), a transmission, an infotainment system, a light detection and ranging (LIDAR) system, etc., and/or a combination thereof.

The CPU 106 is a multi-core CPU. For example, the CPU 106 includes a plurality of cores (e.g., compute cores, processor cores, etc.) that may execute instructions, application code, etc. The first acceleration resource 108 is a graphics processing unit (GPU). For example, the first acceleration resource 108 may be a GPU that generates computer graphics, executes general-purpose computing, etc. In some examples, the first acceleration resource 108 may generates graphics for the user interface 124. The second acceleration resource 110 is an AI accelerator. For example, the second acceleration resource 110 may be a vision processing unit to effectuate machine or computer vision computing tasks, object-identification computing tasks, etc. The general purpose processing resource 112 is a programmable processor. For example, the general purpose processing resource 112 may be a CPU, a GPU, etc. Alternatively, one or more of the first acceleration resource 108, the second acceleration resource 110, and/or the general purpose processing resource 112 may be a different type of hardware such as a digital signal processor (DSP), an application specific integrated circuit (ASIC), a programmable logic device (PLD), and/or a field programmable logic device (FPLD) (e.g., a field-programmable gate array (FPGA)).

The interface resource 114 is hardware that implements and/or is representative of one or more interfaces (e.g., computing interfaces, network interfaces, vehicle network or bus interfaces, industrial protocol network or bus interfaces, etc.). For example, the interface resource 114 may be hardware, software, and/or firmware that implements a communication device (e.g., a communication gateway, a network interface card (NIC), a smart NIC, etc.) such as a transmitter, a receiver, a transceiver, a modem, an industrial protocol gateway, a residential gateway, a wireless access point, and/or a network interface to facilitate exchange of data with external machines (e.g., computing devices of any kind) via the network 126. In some examples, the communication is effectuated via a Bluetooth® connection, a controller area network (CAN) bus, an Ethernet connection, a digital subscriber line (DSL) connection, a wireless fidelity (Wi-Fi) connection, a telephone line connection, a coaxial cable system, a satellite system, a line-of-site wireless system, a cellular telephone system, etc. For example, the interface resource 114 may be implemented by any type of interface standard, such as a Bluetooth® interface, a CAN interface, an Ethernet interface, a Wi-Fi interface, a universal serial bus (USB), a near field communication (NFC) interface, and/or a PCI express interface.

The computing system 102 includes the power source 118 to deliver power to resource(s) of the computing system 102. In this example, the power source 118 is implemented by one or more batteries (e.g., lithium-ion batteries or any other chargeable battery or power source). For example, the power source 118 may be chargeable using a power adapter or converter (e.g., an AC/DC power converter), a wall outlet (e.g., a 110 V AC wall outlet, a 220 V AC wall outlet, etc.), etc. In some examples, the power source 118 may be chargeable by a vehicle component such as an alternator.

The computing system 102 includes the datastore 120 to record data (e.g., the lockstep debug data 122, etc.). The datastore 120 may be implemented by a volatile memory (e.g., one or more flip-flops, Synchronous Dynamic Random Access Memory (SDRAM), Dynamic Random Access Memory (DRAM), RAMBUS Dynamic Random Access Memory (RDRAM), etc.) and/or a non-volatile memory (e.g., flash memory). The datastore 120 may additionally or alternatively be implemented by one or more double data rate (DDR) memories, such as DDR, DDR2, DDR3, DDR4, mobile DDR (mDDR), etc. The datastore 120 may additionally or alternatively be implemented by one or more mass storage devices such as hard disk drive(s) (HDD(s)), compact disk (CD) drive(s), digital versatile disk (DVD) drive(s), solid-state disk drive(s), etc. While in the illustrated example the datastore 120 is illustrated as a single datastore, the datastore 120 may be implemented by any number and/or type(s) of datastores. Furthermore, the data stored in the datastore 120 may be in any data format such as, for example, binary data, comma delimited data, tab delimited data, structured query language (SQL) structures, etc.

The computing system 102 is in communication with the user interface 124. For example, the user interface 124 may be implemented by a graphical user interface (GUI), an application display, etc., which may be presented to a user on one or more display devices in circuit with and/or otherwise in communication with the computing system 102. In such examples, a user (e.g., a customer, a developer, a vehicle maintenance technician, a vehicle driver, a vehicle passenger, etc.) controls the computing system 102 via the user interface 124. Alternatively, the computing system 102 may include and/or otherwise implement the user interface 124.

One(s) of the LCL 104A, the CPU 106, the first acceleration resource 108, the second acceleration resource 110, the general purpose processing resource 112, the interface resource 114, the power source 118, and the datastore 120 are in communication with the bus 116. For example, the bus 116 corresponds to, is representative of, and/or otherwise includes at least one of a CAN bus, an Inter-Integrated Circuit (I2C) bus, a Serial Peripheral Interface (SPI) bus, a Peripheral Component Interconnect (PCI) bus, or a JTAG interface. Additionally or alternatively, the bus 116 may implement any other type of computing or electrical bus.

The network 126 is the Internet. However, the network 126 of this example may be implemented using any suitable wired and/or wireless network(s) including, for example, one or more data buses, one or more Local Area Networks (LANs), one or more wireless LANs (WLANs), one or more cellular networks, one or more private networks, one or more public networks, etc. In some examples, the network 126 enables the computing system 102 to be in communication with the central facility 128.

The central facility 128 is implemented by one or more servers that collect and process the lockstep debug data 122 from the computing system 102. Additionally or alternatively, the central facility 128 may include, correspond to, and/or otherwise be representative of, any other type of computing device, such as a desktop computer, a mobile device (e.g., a smartphone, an Internet-enabled smartphone, etc.), a laptop computer, a tablet (e.g., a tablet computer, an Internet-enabled tablet computer, etc.), etc.

In some examples, the central facility 128 may obtain the lockstep debug data 122 from the computing system 102 via the network 126 by way of an Internet interface to receive Internet messages (e.g., HyperText Transfer Protocol (HTTP) request(s)) that include the lockstep debug data 122. Additionally or alternatively, the central facility 128 may receive the lockstep debug data 122 from the computing system 102 via the network 126 by utilizing any other communication protocol such as an HTTP Secure protocol (HTTPS), a file transfer protocol (FTP), a secure file transfer protocol (SFTP), etc. In some examples, the central facility 128 may analyze the lockstep debug data 122 to identify fault conditions of the computing system 102 detected by the LCL 104. The central facility 128 may identify improvement(s) to the LCL 104 based on the identified fault conditions and subsequent analysis.

In some examples, the LCL 104 includes redundant hardware and one or more comparators for detection of lockstep fault conditions. For example, the LCL 104 may include a redundant or separate instance of the CPU 106, a redundant or separate instance of the first acceleration resource 108, a redundant or separate instance of the second acceleration resource 110, etc. For example, the LCL 104 may include an instance of the CPU 106 and one or more comparators. In some examples, the LCL 104 may execute instructions substantially in parallel with another resource of the computing system 102. For example, the LCL 104 and the CPU 106 (or cores thereof) may execute the same instructions to generate their respective outputs, which become the bases for comparison to detect the fault condition(s).

In some examples, one or more of the CPU 106, the first acceleration resource 108, the second acceleration resource 110, the general purpose processing resource 112, and/or the interface resource 114 is/are lockstep hardware. For example, the CPU 106 may be a lockstep CPU, the first acceleration resource 108 may be a lockstep GPU, etc. In some examples, the CPU 106 is a lockstep CPU and the LCL 104 performs self-test of the lockstep capabilities, functionality, etc., of the CPU 106. For example, the LCL 104 may include one or more comparators (e.g., lockstep comparators) that may compare first outputs of one or more cores of the CPU 106, and/or, more generally, the CPU 106, to second outputs of the LCL 104, which may include another instance of the CPU 106, to detect lockstep failure. In some examples, the LCL 104 may detect the lockstep failure in response to a detection of a fault condition.

In some examples, the LCL 104 implements relatively fast diagnostic execution. For example, the LCL 104 may complete a self-test of the lockstep of the CPU 106 in 8 CPU cycles compared to thousands of CPU cycles that may be needed by prior lockstep testing techniques. In some examples, the LCL 104 enables a corresponding resource to always be online. For example, the LCL 104 may execute a self-test of the lockstep of the CPU 106 while the CPU 106 is online and/or otherwise executing application code, instructions, etc. In some examples, the LCL 104 may generate comprehensive information that may be used to debug lockstep failure and output the comprehensive information as the lockstep debug data 122. For example, the LCL 104 may generate and/or otherwise output the lockstep debug data 122 to include highly-granular data, such as an identification of a port (e.g., an integrated circuit port, a hardware port, etc.) that failed the self-test, a program counter value (e.g., a register in the CPU 106 that includes the address or location of the instruction being executed at a specified time) in response to a detection of a fault condition, etc. In some examples, the LCL 104 may freeze a compare state in response to the detection of the fault condition and may make the compare state readable (e.g., present the compare state on the user interface 124, store the compare state in the lockstep debug data 122, etc.), latching the program counter value of the CPU 106, etc., and/or a combination thereof.

Figure 2:
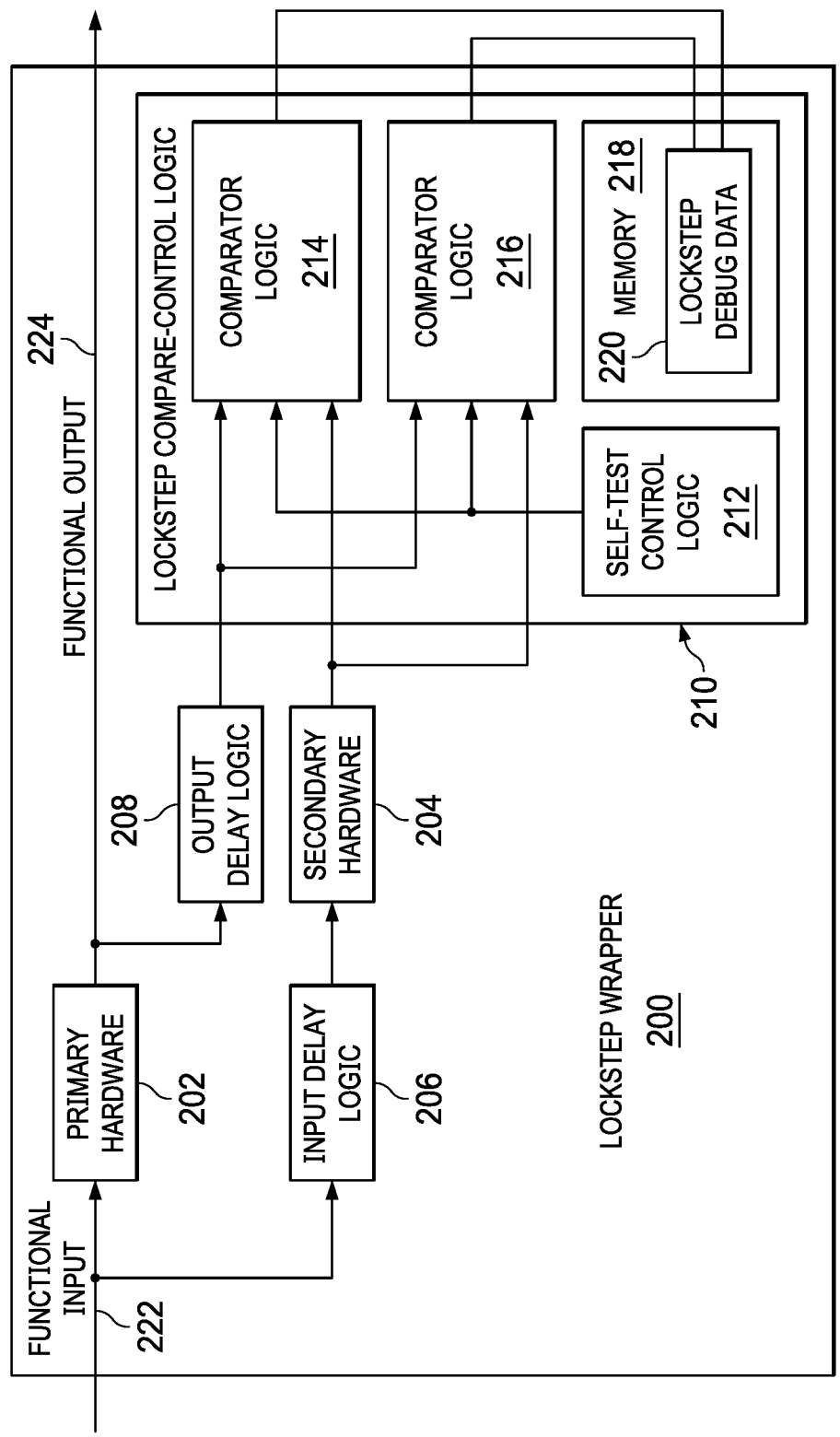
FIG. 2 is a block diagram of an example implementation of the example hardware processor of FIG. 1, which includes the example lockstep comparator circuitry of FIG. 1.

FIG. 2 is a block diagram of an example lockstep wrapper 200. The lockstep wrapper 200 is a logical construct associated with one or more portions of a system, such as the computing system 102 of FIG. 1. For example, the lockstep wrapper 200 may be implemented by hardware, software, firmware and/or a combination thereof. In some examples, the lockstep wrapper 200 may implement the LCL 104 and the CPU 106 of FIG. 1. Alternatively, the lockstep wrapper 200 may implement the LCL 104 and any other resource of the computing system 102, such as the first acceleration resource 108, the second acceleration resource 110, etc.

The lockstep wrapper 200 includes example primary hardware 202, example secondary hardware 204, example input delay logic 206, example output delay logic 208, and example lockstep compare-control logic 210. In this example, the lockstep compare-control logic 210 includes self-test control logic 212, first example comparator logic 214, second example comparator logic 216, and example memory 218. In this example, the memory 218 includes the lockstep debug data 220.

Inputs of the primary hardware 202 are coupled to another resource of a computing system (e.g., the computing system 102) via a bus (e.g., the bus 116 of FIG. 1). Outputs of the primary hardware 202 are coupled to the output delay logic 208 and/or another resource of the computing system via the bus. As used herein, couplings associated with an input and/or output of a component, a device, an integrated circuit, or the like, may be implemented by one or more terminals. For example, a first output terminal, a second output terminal, etc., of the primary hardware 202 may be coupled to a respective one of a first input terminal, a second input terminal, etc., of the output delay logic 208. In some examples, the one or more terminals may be constructed with and/or otherwise be composed of aluminum, copper, etc., or any other conductive material or combination thereof. In some examples, the one or more terminals may be implemented as pins (e.g., integrated circuit pins). Alternatively, the one or more terminals may be implemented as legs (e.g., conductive legs), lugs (e.g., conductive lugs), or any other type of electrical contact.

Outputs of the output delay logic 208 are coupled to inputs of the first comparator logic 214, inputs of the second comparator logic 216, and/or, more generally, inputs of the lockstep compare-control logic 210. Inputs of the input delay logic 206 may be coupled to another resource of the computing system via the bus. Outputs of the input delay logic 206 are coupled to inputs of the secondary hardware 204. Outputs of the secondary hardware 204 are coupled to inputs of the first comparator logic 214, inputs of the second comparator logic 216, and/or, more generally, inputs of the lockstep compare-control logic 210. Outputs of the self-test control logic 212 are coupled to the inputs of the first comparator logic 214 and the inputs of the second comparator logic 216. Outputs of the first comparator logic 214 are coupled to inputs of the memory 218. Outputs of the second comparator logic 216 are coupled to inputs of the memory 218. Additionally or alternatively, outputs of the first comparator logic 214 and/or the second comparator logic 216 may be coupled to the primary hardware 202, the second hardware 204, and/or a different resource of the computing system via the bus.

In some examples, the primary hardware 202 may implement a resource of the computing system 102. For example, the primary hardware 202 may implement the CPU 106. Alternatively, the primary hardware 202 may be implemented by and/or otherwise correspond to the first acceleration resource 108, the second acceleration resource 110, etc., of FIG. 1. In some examples, the secondary hardware 204 may implement a redundant and/or otherwise a separate instance of the primary hardware 202. For example, the secondary hardware 204 may be implemented by another instance of the CPU 106. Alternatively, the secondary hardware 204 may be implemented by and/or otherwise correspond to the first acceleration resource 108, the second acceleration resource 110, etc., of FIG. 1.

In some examples, the self-test control logic 212 may be implemented by a hardware state machine. Alternatively, the self-test control logic 212 may be implemented by one or more analog or digital circuit(s), logic circuits, programmable processor(s), programmable controller(s), ASIC(s), PLD(s), and/or FPLD(s). In some examples, the memory 218 may be implemented by non-volatile memory, volatile memory, etc. In some examples, the lockstep debug data 220 may be implemented by the lockstep debug data 122 of FIG. 1.

In this example, the secondary hardware 204 is redundant hardware with respect to the primary hardware 202. In this example, the secondary hardware 204 is configured in a lockstep configuration. For example, the secondary hardware 204 may obtain the same inputs as the primary hardware 202, which, in this example, correspond to example functional inputs 222. For example, the functional inputs 222 may be implemented by computer, machine, and/or otherwise hardware readable instructions. In some examples, the primary module 202 outputs example functional outputs 224 in response to executing the functional inputs 222. In some examples, the secondary module 204 outputs example lockstep outputs 226 in response to executing the functional inputs 222.

The lockstep wrapper 200 includes the input delay logic 206 to insert a delay (e.g., a time or timing delay) between the primary hardware 202 receiving the functional inputs 222 and the secondary hardware 204 receiving the functional inputs 222. For example, the input delay logic 206 may insert the delay to ensure that the data, the signals, etc., being compared by the first comparator logic 214, the second comparator logic 216, etc., are time aligned. In such examples, the input delay logic 206 may insert the delay to mitigate and/or otherwise reduce comparator errors in response to intermittent processing delays, propagation delays, etc., associated with one or more components of the lockstep wrapper 200, and/or, more generally, the computing system 102 of FIG. 1. In some examples, the input delay logic 206 may be implemented by one or more analog circuits, one or more or digital circuits, one or more logic circuits, etc.

The lockstep wrapper 200 includes the output delay logic 208 to insert a delay (e.g., a time or timing delay) between the primary hardware 202 outputting the functional outputs 224 and the lockstep compare-control logic 210 receiving the functional outputs 224. For example, the output delay logic 208 may insert the delay to ensure that the data, the signals, etc., being compared by the first comparator logic 214, the second comparator logic 216, etc., are time aligned. In such examples, the output delay logic 208 may insert the delay to mitigate and/or otherwise reduce comparator errors in response to intermittent processing delays, propagation delays, etc., associated with one or more components of the lockstep wrapper 200, and/or, more generally, the computing system 102 of FIG. 1. In some examples, the output delay logic 208 may be implemented by one or more analog circuits, one or more or digital circuits, one or more logic circuits, etc.

In example operation, the primary hardware 202 receives the functional inputs 222 at a first time and the secondary hardware 204 receives the functional inputs 222 at a second time after the first time. For example, the time difference between the first time and the second time is implemented by the input delay logic 206. The primary hardware 202 may generate the functional outputs 224 based on the functional inputs 222 and the secondary hardware 204 may generate the lockstep outputs 226 based on the functional inputs 222.

In example operation, the self-test control logic 212 may select (i) the first comparator logic 214 to execute functional comparisons of the functional outputs 224 and the lockstep outputs 226 to test the lockstep and (ii) the second comparator logic 216 to execute a self-test of the second comparator logic 216. Advantageously, the self-test control logic 212 may keep the lockstep online during self-testing by enabling at least one of the first comparator logic 214 or the second comparator logic 216 to execute functional comparisons during self-testing.

In example operation, the first comparator logic 214 may be utilized to compare the functional outputs 224 and the lockstep outputs 226 to execute functional comparisons (e.g., whether the outputs match) to test the comparing functionality of the lockstep compare-control logic 210. In example operation, the second comparator logic 216 may perform a self-test of the second comparator logic 216. For example, the self-test control logic 212 may output all logic zeros (or all logic ones) to the second comparator logic 216 to effectuate a match test. For example, the match test may be implemented by comparing a first set of logic zeros from the self-test control logic 212 to a second set of logic zeros from the self-test control logic 212. In some such examples, the match test may indicate whether one or more logic gates of the second comparator logic 216 are stuck and/or otherwise frozen in a logic one state (e.g., always outputting a logic one), a logic zero state (e.g., always outputting a logic zero), etc.

In some examples, the self-test logic control 212 may output all logic ones to the second comparator logic 216 during a first cycle (e.g., a first clock cycle) or first time period to determine whether one or more logic gates of the second comparator logic 216 are stuck in a logic zero state. In some examples, the self-test control logic 212 may output all logic zeros to the second comparator logic 216 during a second cycle (e.g., a second clock cycle) after the first cycle to determine whether one or more logic gates of the second comparator logic 216 are stuck in a logic one state. For example, the match test may be implemented in two clock cycles by outputting all logic ones during the first cycle and outputting all logic zeros during the second cycle.

In some examples, the self-test control logic 212 may output a combination of values to the second comparator logic 216 to effectuate a mismatch test. For example, the mismatch test may indicate whether one or more logic gates of the second comparator logic 216 are stuck and/or otherwise frozen in a logic one state (e.g., always outputting a logic one), a logic zero state (e.g., always outputting a logic zero), etc. In some examples, the self-test control logic 212 may output logic ones to first input(s) of logic gates and logic zeros to second input(s) of the logic gates of the second comparator logic 216 during a first cycle (e.g., a first clock cycle) to determine whether one or more of the logic gates, are stuck in a logic zero (or logic one) state. In some examples, the self-test control logic 212 may output logic zeros to the first input(s) of the logic gates and logic ones to the second input(s) of the logic gates of the second comparator logic 216 during a second cycle (e.g., a second clock cycle) to determine whether one or more of the logic gates are stuck in a logic zero (or logic one) state. For example, the mismatch test may be implemented in two clock cycles by (i) outputting logic ones to the first input(s) of the logic gates and logic zeros to the second input(s) of the logic gates during the first cycle and (ii) outputting logic zeros to the first input(s) of the logic gates and logic ones to the second input(s) of the logic gates during the second cycle.

In example operation, in response to the second comparator logic 216 detecting a fault condition associated with the second comparator logic 216 based on a failing of at least one of the match test or the mismatch test, the second comparator 216 may output the fault condition, a latching of a program counter value, etc., to the lockstep debug data 220 of the memory 218. In example operation, the lockstep compare-control logic 210 may make the lockstep debug data 220 available for retrieval by a resource of the computing system 102 via the bus. In example operation, in response to the self-test executed by the second comparator logic 216, the self-test control logic 212 may select (i) the second comparator logic 216 to execute functional comparisons of the functional outputs 224 and the lockstep outputs 226 to check the functionality and (ii) the first comparator logic 214 to execute a self-test of first comparator logic 214.

While an example manner of implementing the LCL 104 of FIG. 1 is illustrated in FIG. 2, one or more of the elements, processes and/or devices illustrated in FIG. 2 may be combined, divided, re-arranged, omitted, eliminated and/or implemented in any other way. Further, the example primary hardware 202, the example secondary hardware 204, the example input delay logic 206, the example output delay logic 208, the example lockstep compare-control logic 210, the example self-test control logic 212, the first example comparator logic 214, the second example comparator logic 216, the example memory 218, the example lockstep debug data 220, and/or, more generally, the example lockstep wrapper 200 of FIG. 2 may be implemented by hardware, software, firmware and/or any combination of hardware, software and/or firmware. Thus, for example, any of the example primary hardware 202, the example secondary hardware 204, the example input delay logic 206, the example output delay logic 208, the example lockstep compare-control logic 210, the example self-test control logic 212, the first example comparator logic 214, the second example comparator logic 216, the example memory 218, the example lockstep debug data 220, and/or, more generally, the example lockstep wrapper 200 could be implemented by one or more analog or digital circuit(s), logic circuits, programmable processor(s), programmable controller(s), GPU(s), DSP(s), ASIC(s), PLD(s), and/or FPLD(s). When reading any of the apparatus or system claims of this patent to cover a purely software and/or firmware implementation, at least one of the example primary hardware 202, the example secondary hardware 204, the example input delay logic 206, the example output delay logic 208, the example lockstep compare-control logic 210, the example self-test control logic 212, the first example comparator logic 214, the second example comparator logic 216, the example memory 218, and/or the example lockstep debug data 220 is/are hereby expressly defined to include a non-transitory computer readable storage device or storage disk such as a memory, a DVD, a CD, a Blu-ray disk, etc. including the software and/or firmware. Further still, the example LCL 104 of FIG. 1 may include one or more elements, processes and/or devices in addition to, or instead of, those illustrated in FIG. 2, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 3:
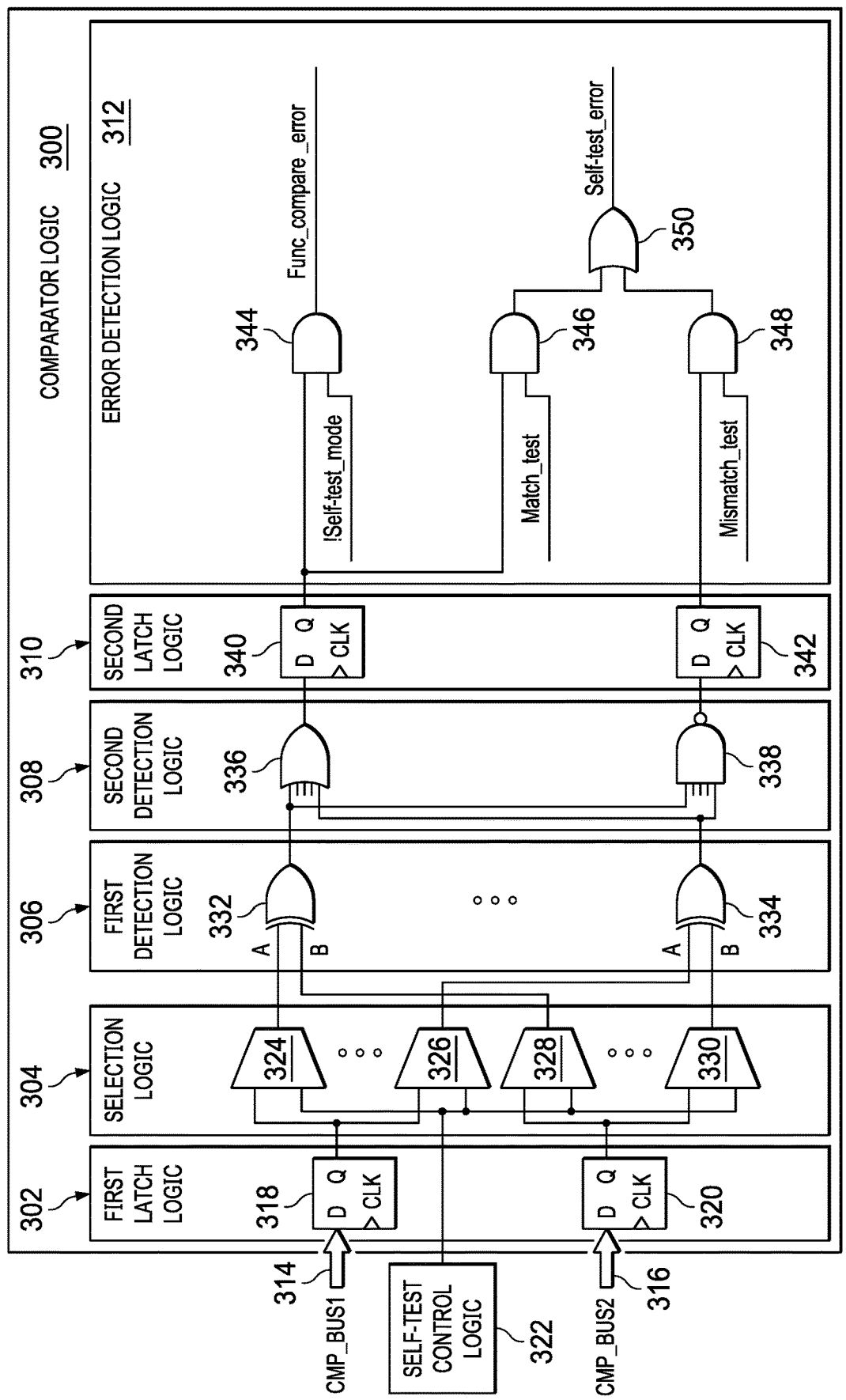
FIG. 3 is a schematic illustration of an example implementation of the example lockstep comparator circuitry of FIGS. 1 and/or 2.

FIG. 3 is a schematic illustration of example comparator logic 300. The comparator logic 300 may be an example implementation of the first comparator logic 214 of FIG. 2, the second comparator logic 216 of FIG. 2, and/or, more generally, the LCL 104 of FIG. 1. The comparator logic 300 includes first example latch logic 302, example selection logic 304, first example detection logic 306, second example detection logic 308, second example latch logic 310, and example error detection logic 312.

The comparator logic 300 includes the first latch logic 302 to latch inputs from example buses 314, 316 to the selection logic 304. The buses 314, 316 include a first example bus (CMP_BUS1) 314 and a second example bus (CMP_BUS2) 316. For example, the first bus 314 may be implemented by the outputs from the output delay logic 208 of FIG. 2. In some examples, the second bus 316 may be implemented by the lockstep outputs 226 from the secondary hardware 204 of FIG. 2. The first latch logic 302 includes a first example latch 318 and a second example latch 320. The first latch 318 and the second latch 320 are D flip-flops. Alternatively, the first latch 318 and/or the second latch 320 may be implemented with any other type of latch or flip-flop. An input of the first latch 318 is coupled to the first bus 314 and an input of the second latch 320 is coupled to the second bus 316.

The comparator logic 300 includes the selection logic 304 to select whether the comparator logic 300 is to perform functional comparisons (e.g., lockstep tests, online lockstep testing, etc.) or self-tests based on a command, an instruction, etc., from example self-test control logic 322. In some examples, the self-test logic control logic 322 may implement the self-test control logic 212 of FIG. 2. In some examples, the self-test control logic 322 may be implemented by a hardware state machine. Alternatively, the self-test control logic 322 may be implemented by one or more analog or digital circuit(s), logic circuits, programmable processor(s), programmable controller(s), ASIC(s), PLD(s), and/or FPLD(s).

The selection logic 304 includes a plurality of example multiplexers 324, 326, 328, 330, which include a first example multiplexer 324, a second example multiplexer 326, a third example multiplexer 328, and a fourth example multiplexer 330. The plurality of multiplexers 324, 326, 328, 330 include a first set of multiplexers and a second set of multiplexers. The first set of multiplexers include a first portion of the plurality of the multiplexers 324, 326, 328, 330. The first portion includes the first multiplexer 324 and the second multiplexer 326. The second set of multiplexers include a second portion of the plurality of the multiplexers 324, 326, 328, 330. The second portion includes the third multiplexer 328 and the fourth multiplexer 330.

Respective first inputs of the first set of the plurality of the multiplexers 324, 326, 328, 330 are coupled to an output of the first latch 318. Respective second inputs of the first set of the plurality of the multiplexers 324, 326, 328, 330 are coupled to respective outputs of the self-test control logic 322. Respective first inputs of the second set of the plurality of the multiplexers 324, 326, 328, 330 are coupled to an output of the second latch 320. Respective second inputs of the second set of the plurality of the multiplexers 324, 326, 328, 330 are coupled to respective outputs of the self-test control logic 322.

Only four multiplexers of the selection logic 304 are depicted in FIG. 3 for clarity. Alternatively, fewer or more multiplexers may be used to implement the selection logic 304 than those depicted in FIG. 3. For example, the number of the plurality of the multiplexers 324, 326, 328, 330 may correspond to a number of outputs from a resource to be tested. In some examples, the number of the plurality of the multiplexers 324, 326, 328, 330 may be equal to and/or otherwise correspond to twice a number of outputs to be tested from the primary hardware 202 of FIG. 2.

The comparator logic 300 includes the first detection logic 306 to detect differences between outputs of the selection logic 304. The first detection logic 306 includes a plurality of first example logic gates 332, 334. The logic gates 332, 334 are exclusive-or (XOR) logic gates. Alternatively, one or more of the logic gates 332, 334 may be a different type of logic gate. The plurality of the first logic gates 332, 334 include a first example logic gate 332 and a second example logic gate 334. Respective first inputs of the logic gates 332, 334 are coupled to respective outputs of the first set of the plurality of the multiplexers 324, 326, 328, 330. For example, a first input of the first logic gate 332 is coupled to an output of the first multiplexer 324 and a first input of the second logic gate 334 is coupled to an output of the second multiplexer 326. Respective second inputs of the logic gates 332, 334 are coupled to respective outputs of the second set of the plurality of the multiplexers 324, 326, 328, 330. For example, a second input of the first logic gate 332 is coupled to an output of the third multiplexer 328 and a second input of the second logic gate 334 is coupled to an output of the fourth multiplexer 330.

Only two logic gates of the first detection logic 306 are depicted in FIG. 3 for clarity. Alternatively, fewer or more logic gates may be used to implement the first detection logic 306 than those depicted in FIG. 3. For example, the number of the first logic gates 332, 334 may correspond to N/2 logic gates, where N is the number of the plurality of the multiplexers 324, 326, 328, 330. In some examples, the number of the first logic gates 332, 334 may be equal to and/or otherwise correspond to the number of the outputs to be tested from the primary hardware 202 of FIG. 2.

The comparator logic 300 includes the second detection logic 308 to detect whether there is at least one logic one from the outputs of the first detection logic 306. The second detection logic 308 include second example logic gates 336, 338, which include a third example logic gate 336 and a fourth example logic gate 338. The third logic gate 336 is an OR logic gate. The fourth logic gate 338 is a not-and (NAND) logic gate. Alternatively, the third logic gate 336 and/or the fourth logic gate 338 may be implemented with a different type and/or quantity of logic gates. Respective first inputs of the third logic gate 336 are coupled to respective outputs of the first logic gates 332, 334. For example, a first input of the third logic gate 336 is coupled to an output of the first logic gate 332 and a second input of the third logic gate 336 is coupled to an output of the second logic gate 334. Respective inputs of the fourth logic gate 338 are coupled to respective outputs of the first logic gates 332, 334. For example, a first input of the fourth logic gate 338 is coupled to an output of the first logic gate 332 and a second input of the fourth logic gate 338 is coupled to an output of the second logic gate 334.

The comparator logic 300 includes the second latch logic 310 to latch outputs from the second detection logic 308 to the error detection logic 312. The second latch logic 310 includes a third example latch 340 and a fourth example latch 342. The third latch 340 and the fourth latch 342 are D flip-flops. Alternatively, the third latch 340 and/or the fourth latch 342 may be implemented with any other type of latch or flip-flop. An input of the third latch 340 is coupled to an output of the third logic gate 336. An input of the fourth latch 342 is coupled to an output of the fourth logic gate 338.

The comparator logic 300 includes the error detection logic 312 to detect a fault condition or error in connection with lockstep operation, functionality, etc., of the lockstep wrapper 200 of FIG. 2. The error detection logic 312 includes a fifth example logic gate 344, a sixth example logic gate 346, a seventh example logic gate 348, and an eighth example logic gate 350. The fifth logic gate 344, the sixth logic gate 346, and the seventh logic gate 348 are AND logic gates. Alternatively, one or more of the fifth logic gate 344, the sixth logic gate 346, and/or the seventh logic gate 348 may be implemented by a different type and/or quantity of logic gates. The eighth logic gate 350 is an OR logic gate. Alternatively, the eighth logic gate 350 may be implemented with a different type and/or quantity of logic gates.

A first input of the fifth logic gate 344 is coupled to an output of the third latch 340. A second input (!SELF-TEST_MODE) of the fifth logic gate 344 is coupled to external logic to the comparator logic 300. For example, the second input of the fifth logic gate 344 may be coupled to an output of the self-test control logic 322. For example, the second input may be configured to receive a first control signal implemented by !SELF-TEST_MODE. An output of the fifth logic gate 344 (FUNC_COMPARE_ERROR) is coupled to external logic to the comparator logic 300. For example, the output of the fifth logic gate 344 may be coupled to the memory 218 of FIG. 2.

A first input of the sixth logic gate 346 is coupled to an output of the third latch 340. A second input (MATCH_TEST) of the sixth logic gate 346 is coupled to external logic to the comparator logic 300. For example, the second input of the sixth logic gate 346 may be coupled to an output of the self-test control logic 322. For example, the second input may be configured to receive a second control signal implemented by MATCH_TEST.

A first input of the seventh logic gate 348 is coupled to an output of the fourth latch 342. A second input (MISMATCH_TEST) of the seventh logic gate 348 is coupled to external logic to the comparator logic 300. For example, the second input of the seventh logic gate 348 may be coupled to an output of the self-test control logic 322. For example, the second input may be configured to receive a second control signal implemented by MISMATCH_TEST.

A first input of the eighth logic gate 350 is coupled to an output of the sixth logic gate 346. A second input of the eighth logic gate 350 is coupled to an output of the seventh logic gate 348. An output of the eighth logic gate 350 (SELF-TEST_ERROR) may be coupled to external logic to the comparator logic 300. For example, the output of the eighth logic gate 350 may be coupled to the memory 218 of FIG. 2.

In example operation, the self-test control logic 322 may select whether the comparator logic 300 is to test the lockstep or functional comparisons. For example, the self-test control logic 322 may instruct the selection logic 304, and/or, more generally, the comparator logic 300, to test for comparisons of the functional outputs from the first bus 314 and/or the second bus 316. In such examples, the self-test control logic 322 may de-assert a self-test mode signal (SELF-TEST_MODE). In such examples, the self-test control logic 322 may output a signal (e.g., a selection signal) to the plurality of the multiplexers 324, 326, 328, 330 to select the inputs from the first latch 318 and the second latch 320 to output to the first detection logic 306. For example, the first logic gates 332, 334 may compare first input(s) from the first bus 314 to second input(s) from the second bus 316. The third logic gate 336 may assert a logic one in response to at least one of the outputs from the first logic gates 332, 334 being a logic one. For example, the third logic gate 336 may assert a logic one based on a determination that one(s) of the first logic gates 332, 334 detected a mismatch of one(s) of inputs from the buses 314, 316. In such examples, the fifth logic gate 344 may assert a logic one as the FUNC_COMPARE_ERROR signal based on the detected mismatch and the assertion of the signal at the second input of the fifth logic gate 344.

In some examples, the self-test control logic 322 may instruct the selection logic 304, and/or, more generally, the comparator logic 300, to execute a self-test of the comparator logic 300. In such examples, the self-test control logic 322 may assert the self-test mode signal (SELF-TEST_MODE) and assert a match test mode signal (MATCH_TEST) to cause the comparator logic 300 to perform a match test.

In some examples, the self-test control logic 322 causes the match test to be performed by the comparator logic 300 in two cycles. For example, the self-test control logic 322 may output a signal (e.g., a selection signal) to the plurality of the multiplexers 324, 326, 328, 330 to select the inputs from the self-test control logic 322 to output to the first detection logic 306. For example, the self-test control logic 322 may output a logic zero during a first cycle or a logic one during a second cycle (after the first cycle) to each of the plurality of the multiplexers 324, 326, 328, 330 to effectuate a match test. In such examples, the first logic gates 332, 334 may compare the logic zeros output from the plurality of the multiplexers 324, 326, 328, 330 during the first cycle and the logic ones output from the plurality of the multiplexers 324, 326, 328, 330 during the second cycle. The third logic gate 336 may assert a logic one during the first cycle in response to at least one of the outputs from the first logic gates 332, 334 being a logic one, which may indicate that at least one of the first logic gates 332, 334 are stuck and/or otherwise latched on a logic one output state. The third logic gate 336 may assert a logic one during the second cycle in response to at least one of the outputs from the first logic gates 332, 334 being a logic one, which may indicate that at least one of the first logic gates 332, 334 are stuck and/or otherwise latched on a logic zero output state. For example, the third logic gate 336 may assert a logic one based on a determination that one(s) of the first logic gates 332, 334 are not generating outputs based on their inputs. In such examples, the sixth logic gate 346 may assert a logic one to the eighth logic gate 350, which, in turn, asserts a logic one as the SELF-TEST_ERROR signal. In some such examples, the assertion of the SELF-TEST_ERROR signal indicates a detection of a fault condition of the comparator logic 300, the indication of which may be stored as the lockstep debug data 220 in the memory 218 of FIG. 2.

In some examples, the self-test control logic 322 may assert the self-test mode signal (SELF-TEST_MODE) and assert a mismatch test mode signal (MISMATCH_TEST) to cause the comparator logic 300 to perform a mismatch test. In such examples, the self-test control logic 322 may output a signal (e.g., a selection signal) to the plurality of the multiplexers 324, 326, 328, 330 to select the inputs from the self-test control logic 322 to output to the first detection logic 306. For example, the self-test control logic 322 may output during a first cycle a logic one to the first portion of the multiplexers 324, 326, 328, 330, such as the first multiplexer 324 and the second multiplexer 326, and a logic zero to the second portion of the multiplexers 324, 326, 328, 330, such as the third multiplexer 328 and the fourth multiplexer 330. In such examples, the self-test control logic 322 may output during a second cycle (after the first cycle) a logic zero to the first portion of the multiplexers 324, 326, 328, 330, such as the first multiplexer 324 and the second multiplexer 326, and a logic one to the second portion of the multiplexers 324, 326, 328, 330, such as the third multiplexer 328 and the fourth multiplexer 330. In some such examples, the self-test control logic 322 may effectuate a mismatch test based on the forcing of these two different values (e.g., the logic zero(s), the logic one(s), etc.) during the two cycles.

In such examples, the first logic gates 332, 334 may compare the logic outputs from the plurality of the multiplexers 324, 326, 328, 330. The fourth logic gate 338 may assert a logic one in response to at least one of the outputs from the first logic gates 332, 334 being a logic zero, which may indicate that at least one of the first logic gates 332, 334 are stuck and/or otherwise latched on a logic zero output state. For example, the fourth logic gate 338 may assert a logic one based on a determination that one(s) of the first logic gates 332, 334 are not generating outputs based on their inputs. In such examples, the seventh logic gate 348 may assert a logic one to the eighth logic gate 350, which, in turn, asserts a logic one as the SELF-TEST ERROR signal. In some such examples, the assertion of the SELF-TEST ERROR signal indicates a detection of a fault condition of the comparator logic 300, the indication of which may be stored as the lockstep debug data 220 in the memory 218 of FIG. 2. Advantageously, the self-test control logic 322 may effectuate a complete self-test of the comparator logic 300 in four cycles based on completing the match test in two cycles and completing the mismatch test in two cycles.

Figure 4A:
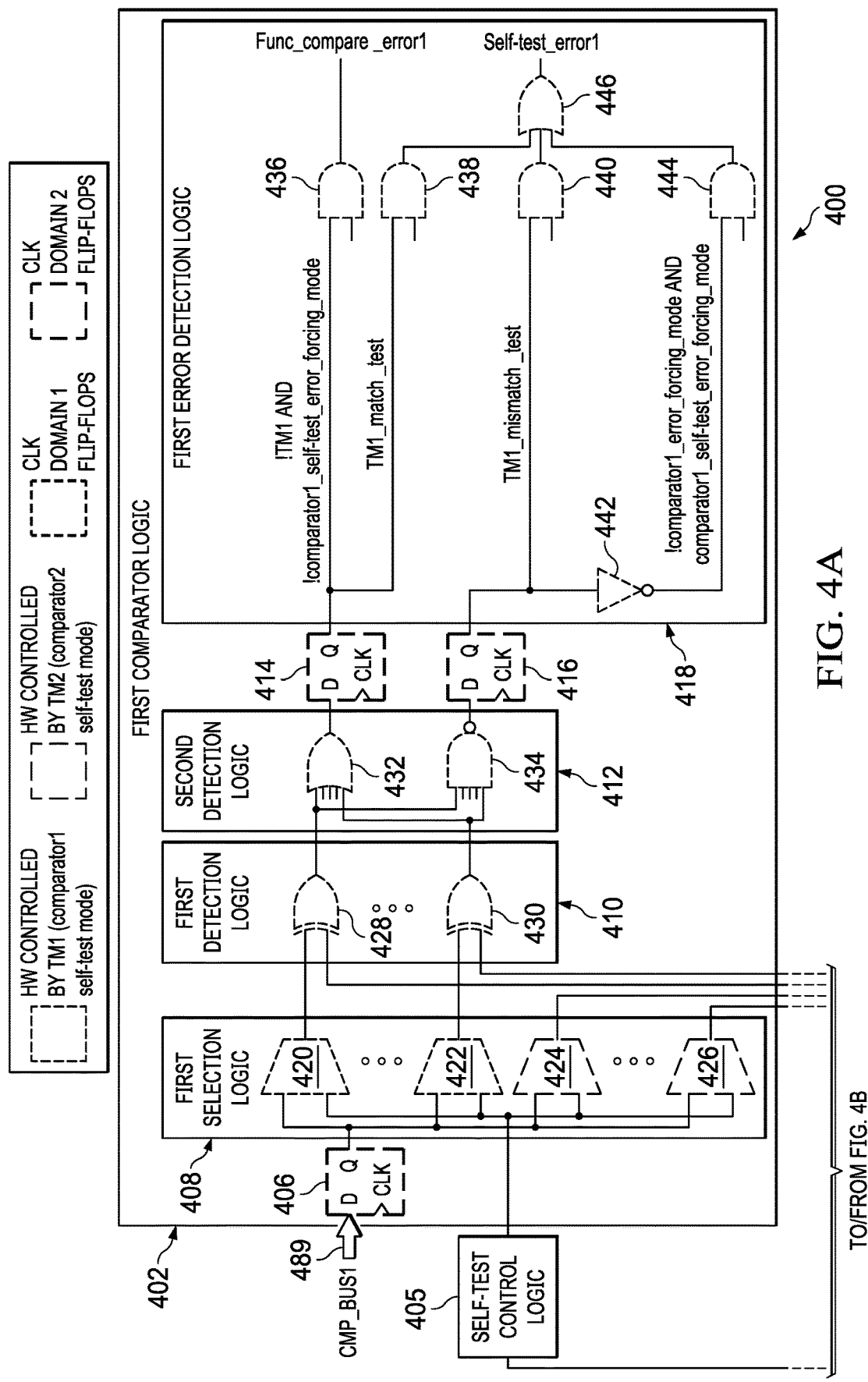
FIGS. 4A-4B are schematic illustrations of another example implementation of the example lockstep comparator circuitry of FIGS. 1 and/or 2.
Figure 4B:
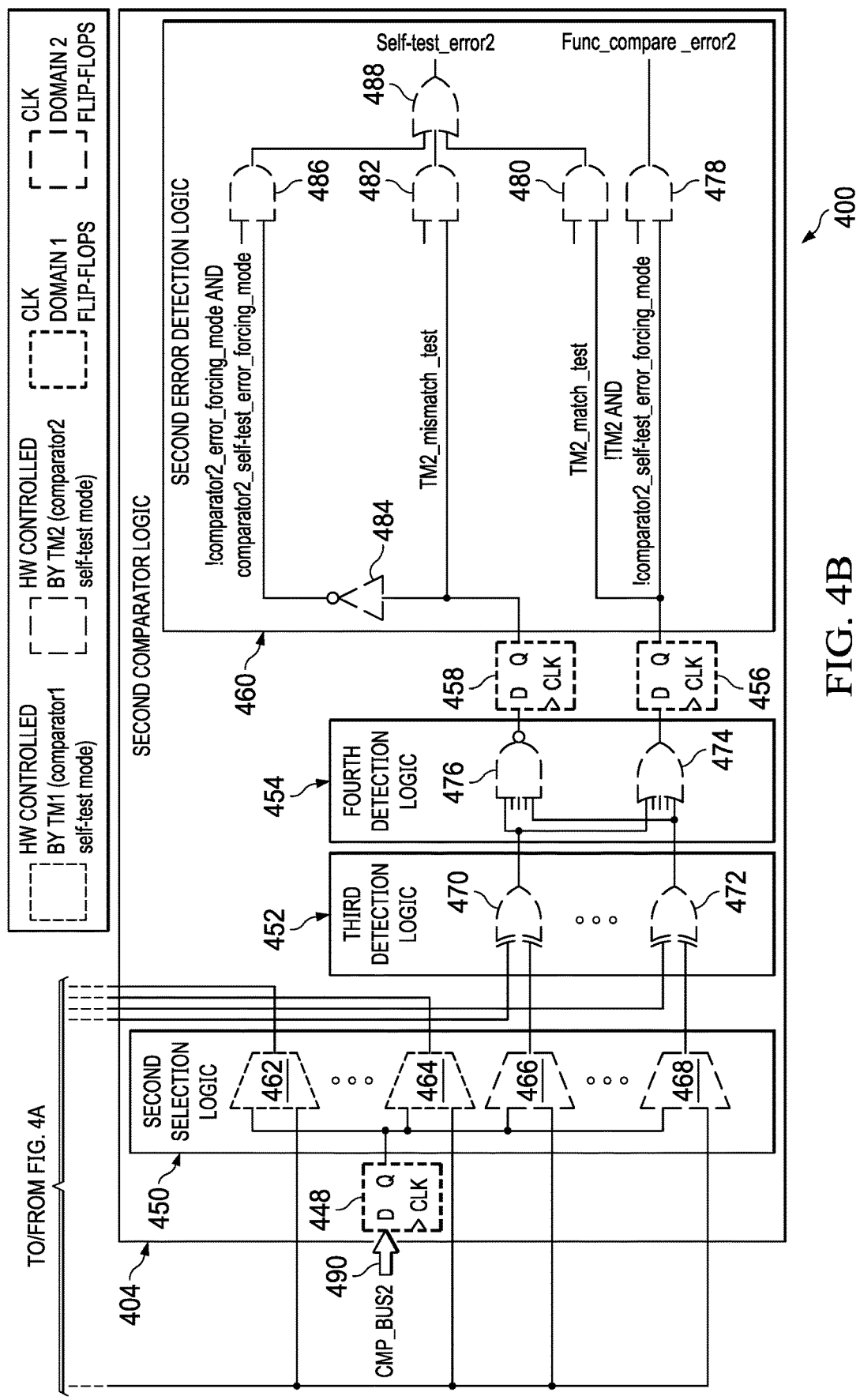

FIGS. 4A-4B are schematic illustrations of example dual comparator logic 400. The dual comparator logic 400 may be an example implementation of the first comparator logic 214 of FIG. 2 and the second comparator logic 216 of FIG. 2, and/or, more generally, the LCL 104 of FIG. 1. The dual comparator logic 400 includes first example comparator logic 402 and second example comparator logic 404. For example, the first comparator logic 402 may implement the first comparator logic 214 of FIG. 2 and/or the second comparator logic 216 of FIG. 2. In some examples, the second comparator logic 404 may implement the first comparator logic 214 of FIG. 2 and/or the second comparator logic 216 of FIG. 2.

Further depicted in FIGS. 4A and/or 4B is example self-test control logic 405. In some examples, the self-test control logic 405 may implement the self-test control logic 212 of FIG. 2 and/or the self-test control logic 322 of FIG. 3. In some examples, the self-test control logic 405 may be implemented by a hardware state machine. Alternatively, the self-test control logic 405 may be implemented by one or more analog or digital circuit(s), logic circuits, programmable processor(s), programmable controller(s), ASIC(s), PLD(s), and/or FPLD(s). In this example, outputs of the self-test control logic 405 are coupled to inputs of the first comparator logic 402 and the second comparator logic 404. In some examples, the dual comparator logic 400 may include the self-test control logic 405.

The first comparator logic 402 includes a first example latch 406, first example selection logic 408, first example detection logic 410, second example detection logic 412, a second example latch 414, a third example latch 416, and first example error detection logic 418. The first selection logic 408 includes a first set of example multiplexers 420, 422 including a first example multiplexer 420 and a second example multiplexer 422. The first selection logic 408 includes a second set of example multiplexers 424, 426 including a third example multiplexer 424 and a fourth example multiplexer 426. The first detection logic 410 includes first example logic gates 428, 430 including a first example logic gate 428 and a second example logic gate 430. The second detection logic 412 includes a third example logic gate 432 and a fourth example logic gate 434. The first error detection logic 418 includes a fifth example logic gate 436, a sixth example logic gate 438, a seventh example logic gate 440, an eighth example logic gate 442, a ninth example logic gate 444, and a tenth example logic gate 446.

Only four multiplexers of the first selection logic 408 are depicted in FIGS. 4A-4B for clarity. Alternatively, fewer or more multiplexers may be used to implement the first selection logic 408 than those depicted in FIGS. 4A-4B. For example, the number of the first set of multiplexers 420, 422 and/or the number of the second set of multiplexers 424, 426 may correspond to a number of outputs from a resource to be tested. In some examples, the number of the first set of multiplexers 420, 422 and/or the number of the second set of multiplexers 424, 426 may be equal to and/or otherwise correspond to twice a number of outputs to be tested from the primary hardware 202 of FIG. 2.

Only two logic gates of the first detection logic 410 are depicted in FIGS. 4A-4B for clarity. Alternatively, fewer or more logic gates may be used to implement the first detection logic 410 than those depicted in FIGS. 4A-4B. For example, the number of the first logic gates 428, 430 may correspond to N/2 logic gates, where N is the number of the multiplexers 420, 422, 424, 426 of the first selection logic 408. In some examples, the number of the first logic gates 428, 430 may be equal to and/or otherwise correspond to the number of the outputs to be tested from the primary hardware 202 of FIG. 2.

The second comparator logic 404 includes a fourth example latch 448, second example selection logic 450, third example detection logic 452, fourth example detection logic 454, a fifth example latch 456, a sixth example latch 458, and second example error detection logic 460. The second selection logic 450 includes a third example set of multiplexers 462, 464 including a fifth example multiplexer 462 and a sixth example multiplexer 464. The second selection logic 450 includes a fourth example set of multiplexers 466, 468 including a seventh example multiplexer 466 and an eighth example multiplexer 468. The third detection logic 452 includes second example logic gates 470, 472 including a first example logic gate 470 and a second example logic gate 472. The second detection logic 454 includes a third example logic gate 474 and a fourth example logic gate 476. The second error detection logic 460 includes a fifth example logic gate 478, a sixth example logic gate 480, a seventh example logic gate 482, an eighth example logic gate 484, a ninth example logic gate 486, and a tenth example logic gate 488.

Only four multiplexers of the second selection logic 450 are depicted in FIGS. 4A-4B for clarity. Alternatively, fewer or more multiplexers may be used to implement the second selection logic 450 than those depicted in FIGS. 4A-4B. For example, the number of the third set of multiplexers 462, 464 and/or the number of the fourth set of multiplexers 466, 468 may correspond to a number of outputs from a resource to be tested. In some examples, the number of the third set of multiplexers 462, 464 and/or the number of the fourth set of multiplexers 466, 468 may be equal to and/or otherwise correspond to twice a number of outputs to be tested from the primary hardware 202 of FIG. 2.

Only two logic gates of the third detection logic 470 are depicted in FIGS. 4A-4B for clarity. Alternatively, fewer or more logic gates may be used to implement the third detection logic 470 than those depicted in FIGS. 4A-4B. For example, the number of the second logic gates 470, 472 may correspond to N/2 logic gates, where N is the number of the multiplexers 462, 464, 466, 468 of the second selection logic 450. In some examples, the number of the second logic gates 470, 472 may be equal to and/or otherwise correspond to the number of the outputs to be tested from the primary hardware 202 of FIG. 2.

The first latch 406, the second latch 414, the third latch 416, the fourth latch 448, the fifth latch 456, and the sixth latch 458 are D flip-flops. Alternatively, the first latch 318 and/or the second latch 320 may be implemented with any other type of latch or flip-flop. The first logic gates 428, 430 and the second logic gates 470, 472 are XOR logic gates. The third logic gate 432 of the second detection logic 412 and the third logic gate 474 of the fourth detection logic 454 are OR logic gates. The fourth logic gate 434 of the second detection logic 412 and the fourth logic gate 476 of the fourth detection logic 454 are NAND logic gates. The fifth logic gate 436, the sixth logic gate 438, the seventh logic gate 440, and the ninth logic gate 444 of the first error detection logic 418 are AND gates. The eighth logic gate 442 of the first error detection logic 418 and the eighth logic gate 484 of the second error detection logic 460 are inverter logic gates. The tenth logic gate 446 of the first error detection logic 418 and the tenth logic gate 488 of the second error detection logic 460 are OR gates. Alternatively, one or more of the logic gates of the first comparator logic 402 and/or one or more of the logic gates of the second comparator logic 404 may be implemented with different types and/or quantities of logic gates than depicted in the illustrated example of FIGS. 4A-4B.

The first comparator logic 402 includes the first latch 406 to latch inputs from a first example bus (CMP_BUS1) 489 to the first selection logic 408. In some examples, the first bus 489 may be implemented by the outputs from the output delay logic 208 of FIG. 2. The first comparator logic 402 includes the first selection logic 408 to select whether the first comparator logic 402 is to perform functional comparisons (e.g., lockstep tests, online lockstep testing, etc.) or self-tests based on a command, an instruction, etc., from example self-test control logic (e.g., the self-test control logic 212 of FIG. 2, the self-test control logic 322 of FIG. 3, etc.).

Respective first inputs of ones of the first set of multiplexers 420, 422 are coupled to the first latch 406. Respective second inputs of the ones of the first set of multiplexers 420, 422 are coupled to the self-test control logic 405. Respective outputs of the ones of the first set of multiplexers 420, 422 are coupled to respective first inputs of the first logic gates 428, 430. For example, a first input of the first logic gate 428 is coupled to an output of the first multiplexer 420 and a first input of the second logic gate 430 is coupled to an output of the second multiplexer 422. For example, a second input of the first logic gate 428 is coupled to an output of the fifth multiplexer 462 and a second input of the second logic gate 430 is coupled to an output of the sixth multiplexer 464.

The first comparator logic 402 includes the first detection logic 410 to detect differences between outputs of the first selection logic 408. Outputs of the first logic gates 428, 430 are coupled to inputs of the third logic gate 432 and the fourth logic gate 434. For example, output(s) of the first logic gate 428 is coupled to a first input of the third logic gate 432 and a first input of the fourth logic gate 434.

The first comparator logic 402 includes the second detection logic 412 to detect whether there is at least one logic one from the outputs of the first detection logic 410. Outputs of the third logic gate 432 and the fourth logic gate 434 are coupled to respective inputs of the second latch 414 and the third latch 416. For example, an output of the third logic gate 432 is coupled to an input of the second latch 414 and an output of the fourth logic gate 434 is coupled to an input of the third latch 416.

Outputs of the second latch 414 are coupled to a first input of the fifth logic gate 436 and a first input of the sixth logic gate 438. Outputs of the third latch 416 are coupled to a first input of the seventh logic gate 440 and an input of the eighth logic gate 442. An output of the eighth logic gate 442 is coupled to a first input of the ninth logic gate 444. Outputs of the sixth logic gate 438, the seventh logic gate 440, and the ninth logic gate 444 are coupled to respective inputs of the tenth logic gate 446. Outputs of the fifth logic gate 436 (FUNC_COMPARE_ERROR1) and the tenth logic gate 446 (SELF-TEST_ERROR1) may be coupled to external logic to the dual comparator logic 400. For example, the outputs of the fifth logic gate 436 and the tenth logic gate 446 may be coupled to the memory 218 of FIG. 2.

The second comparator logic 404 includes the fourth latch 448 to latch inputs from a second example bus (CMP_BUS2) 490 to the second selection logic 450. In some examples, the second bus 490 may be implemented by the lockstep outputs 226 from the secondary hardware 204 of FIG. 2. The second comparator logic 404 includes the second selection logic 450 to select whether the second comparator logic 404 is to perform functional comparisons (e.g., lockstep tests, online lockstep testing, etc.) or self-tests based on a command, an instruction, etc., from example self-test control logic (e.g., the self-test control logic 212 of FIG. 2, the self-test control logic 322 of FIG. 3, etc.).

Respective first inputs of ones of the third set of multiplexers 462, 464 and the first inputs of ones of the fourth set of multiplexers 466, 468 are coupled to the fourth latch 448. Respective second inputs of the ones of the third set of multiplexers 462, 464 are coupled to the self-test control logic 405. Respective outputs of the ones of the fourth set of multiplexers 466, 468 are coupled to respective first inputs of the second logic gates 470, 472. For example, a first input of the first logic gate 470 is coupled to an output of the third multiplexer 424 and a first input of the second logic gate 472 is coupled to an output of the fourth multiplexer 426. For example, a second input of the first logic gate 470 is coupled to an output of the seventh multiplexer 466 and a second input of the second logic gate 472 is coupled to an output of the eighth multiplexer 468.

The second comparator logic 404 includes the third detection logic 452 to detect differences between outputs of the second selection logic 450. Outputs of the second logic gates 470, 472 are coupled to inputs of the third logic gate 474 and the fourth logic gate 476. For example, output(s) of the first logic gate 470 is coupled to a first input of the third logic gate 474 and a first input of the fourth logic gate 476.

The second comparator logic 404 includes the fourth detection logic 454 to detect whether there is at least one logic one from the outputs of the third detection logic 452. Outputs of the third logic gate 474 and the fourth logic gate 476 are coupled to respective inputs of the fifth latch 456 and the sixth latch 458. For example, an output of the third logic gate 474 is coupled to an input of the fifth latch 456 and an output of the fourth logic gate 476 is coupled to an input of the sixth latch 458.

Outputs of the fifth latch 456 are coupled to a first input of the fifth logic gate 478 and a first input of the sixth logic gate 480. Outputs of the sixth latch 458 are coupled to a first input of the seventh logic gate 482 and an input of the eighth logic gate 484. An output of the eighth logic gate 484 is coupled to a first input of the ninth logic gate 486. Outputs of the sixth logic gate 480, the seventh logic gate 482, and the ninth logic gate 486 are coupled to respective inputs of the tenth logic gate 488. Outputs of the fifth logic gate 478 (FUNC_COMPARE_ERROR2) and the tenth logic gate 488 (SELF-TEST_ERROR2) may be coupled to external logic to the dual comparator logic 400. For example, the outputs of the fifth logic gate 478 and the tenth logic gate 488 may be coupled to the memory 218 of FIG. 2.

In the illustrated example of FIGS. 4A-4B, the dual comparator logic 400 is implemented using at least two different clock domains. In this example, the fourth latch 448, the fifth latch 456, and the sixth latch 458 are implemented using a first clock domain. In this example, the first latch 406, the second latch 414, and the third latch 416 are implemented using a second clock domain different from the first clock domain.

In the illustrated example of FIGS. 4A-4B, the dual comparator logic 400 includes the first error detection logic 418 and the second error detection logic 460 to detect fault condition(s) or error(s) in connection with lockstep operation, functionality, etc., of the lockstep wrapper 200 of FIG. 2. In this example, the dual comparator logic 400 implements two test modes (TM1 and TM2). For example, the dual comparator logic 400 may execute a self-test of the first comparator logic 402 to implement test mode 1 (TM1). In such examples, the self-test control logic 405, and/or, more generally, the dual comparator logic 400, may assert a first test mode signal (TM1) and/or deassert a second test mode signal (TM2) in response to determining to execute the self-test of the first comparator logic 402. In some examples, the dual comparator logic 400 may execute a self-test of the second comparator logic 404 to implement test mode 2 (TM2). In such examples, the self-test control logic 405, and/or, more generally, the dual comparator logic 400, may deassert the first test mode signal and/or assert the second test mode signal in response to determining to execute the self-test of the second comparator logic 404.

In some examples, a second input of the fifth logic gate 436 of the first error detection logic 418 (!TM1 & !COMPARATOR1_SELF-TEST_ERROR_FORCING_MODE) is coupled to the self-test control logic 405. For example, the second input of the fifth logic gate 436 may be coupled to an output of the self-test control logic 405. In some examples, a signal at the second input is asserted in response to the dual comparator logic 400 operating in TM2 (e.g., !TM1) and the first comparator logic 402 not undergoing self-testing (e.g., !COMPARATOR1_SELF-TEST_ERROR_FORCING_MODE).

In some examples, a second input (TM1_MATCH_TEST) of the sixth logic gate 438 of the first error detection logic 418 is coupled to the self-test control logic 405. For example, the second input of the sixth logic gate 438 may be coupled to an output of the self-test control logic 405. In some examples, a signal at the second input may be asserted in response to the first comparator logic 402 executing a self-test of the first comparator logic 402, such as a match test. For example, the match test may be implemented by the first set of multiplexers 420, 422 and the third set of multiplexers 462, 464 outputting all logic zeros (or logic ones) from the self-test control logic 405 to test whether one(s) of the first logic gates 428, 430 are stuck and/or otherwise latched to a logic one (or logic zero) state.

In some examples, a second input (TM1_MISMATCH_TEST) of the seventh logic gate 440 of the first error detection logic 418 is coupled to the self-test control logic 405. For example, the second input of the seventh logic gate 440 may be coupled to an output of the self-test control logic 405. In some examples, a signal at the second input may be asserted in response to the first comparator logic 402 executing a self-test of the first comparator logic 402, such as a mismatch test. For example, the mismatch test may be implemented in two cycles. For example, during a first cycle, the first set of multiplexers 420, 422 may output all logic ones from the self-test logic 405 and the third set of multiplexers 462, 464 may output all logic zeros from the self-test control logic 405 to test whether one(s) of the first logic gates 428, 430 are stuck and/or otherwise latched to a logic zero (or logic one) state. In such examples, during a second cycle after the first cycle, the first set of multiplexers 420, 422 may output all logic zeros from the self-test logic 405 and the third set of multiplexers 462, 464 may output all logic ones from the self-test control logic 405 to test whether one(s) of the first logic gates 428, 430 are stuck and/or otherwise latched to a logic zero (or logic one) state.

In some examples, a second input (!COMPARATOR1_ERROR_FORCING_MODE & COMPARATOR1_SELF-TEST_ERROR_FORCING_MODE) of the ninth logic gate 444 of the first error detection logic 418 is coupled to the self-test control logic 405. For example, the second input may be coupled to an output of the self-test control logic 405. In some examples, a signal at the second input is asserted in response to the first comparator logic 402 not operating in error forcing mode (!COMPARATOR1_ERROR_FORCING_MODE) and the first comparator logic 402 undergoing self-testing, which may be indicated with an assertion of the signal COMPARATOR1_SELF-TEST_ERROR_FORCING_ MODE depicted in this illustrated example.

In some examples, in response to the first comparator logic 402 operating in error forcing mode, which may be implemented with an assertion of a signal COMPARATOR1_ERROR_FORCING_MODE depicted in this illustrated example, the first comparator logic 402 may invert one of the functional outputs from the first bus 489. This may trigger a mismatch, which may be indicated by an assertion of a logic one by the fifth logic gate 436.

In some examples, a second input, which is indicated by signals !TM2 & !COMPARATOR2_SELF-TEST_ERROR_ FORCING_MODE as depicted in this illustrated example, of the fifth logic gate 478 of the second error detection logic 460 is coupled to the self-test control logic 405. For example, the second input may be coupled to an output of the self-test control logic 405. In some examples, a signal at the second input is asserted in response to the dual comparator logic 400 operating in TM1, which may be implemented with the signal !TM2 as depicted in this illustrated example, and the second comparator logic 404 not undergoing self-testing, which may be implemented by the signal !COMPARATOR2_SELF-TEST_ERROR_FORC- ING_MODE as depicted in this illustrated example.

In some examples, a second input, which is indicated by the signal TM2_MATCH_TEST as depicted in this illustrated example, of the sixth logic gate 480 of the second error detection logic 460 is coupled to the self-test control logic 405 to the dual comparator logic 400. For example, the second input of the sixth logic gate 480 may be coupled to an output of the self-test control logic 405. In some such examples, a signal at the second input may be asserted in response to the second comparator logic 404 executing a self-test of the second comparator logic 404, such as a match test. For example, the match test may be implemented by the second set of multiplexers 424, 426 and the fourth set of multiplexers 466, 468 outputting all logic zeros (or logic ones) from the self-test control logic 405 to test whether one(s) of the second logic gates 470, 472 are stuck and/or otherwise latched to a logic one state.

In some examples, a second input, which is indicated by the signal TM2_MISMATCH_TEST as depicted in this illustrated example, of the seventh logic gate 482 of the second error detection logic 460 is coupled to the self-test control logic 405. For example, the second input of the seventh logic gate 482 may be coupled to an output of the self-test control logic 405. In some examples, a signal at the second input may be asserted in response to the second comparator logic 404 executing a self-test of the second comparator logic 404, such as a mismatch test. For example, the mismatch test may be implemented by the second set of multiplexers 424, 426 outputting logic ones and the fourth set of multiplexers 466, 468 outputting logic zeros from the self-test control logic 405 during a first cycle to test whether one(s) of the second logic gates 474, 476 are stuck and/or otherwise latched to a logic zero (or logic one) state. In such examples, the mismatch test may be implemented by the second set of multiplexers 424, 426 outputting logic zeros and the fourth set of multiplexers 466, 468 outputting logic ones from the self-test control logic 405 during a second cycle to test whether one(s) of the second logic gates 474, 476 are stuck and/or otherwise latched to a logic zero (or logic one) state.

In some examples, a second input, which may be implemented by the signal !COMPARATOR2_ERROR_ FORCING_MODE & COMPARATOR2_SELF-TEST_ER- ROR_FORCING_MODE as depicted in this illustrated example, of the ninth logic gate 486 of the second error detection logic 460 is coupled to the self-test control logic 405. For example, the second input may be coupled to an output of the self-test control logic 405. In some examples, a signal at the second input is asserted in response to the second comparator logic 404 not operating in error forcing mode, which may be implemented by the signal !COMPARATOR2_ERROR_FORCING_MODE as depicted in this illustrated example, and the second comparator logic 404 undergoing self-testing, which may be implemented with the signal COMPARATOR2_SELF-TES- T_ERROR_FORCING_MODE as depicted in this illustrated example.

In some examples, in response to the second comparator logic 404 operating in error forcing mode, which may be implemented with an assertion of the signal COMPARATOR2_ERROR_FORCING_MODE depicted in this illustrated example, the second comparator logic 404 may invert one of the functional outputs from the second bus 490. This may trigger a mismatch, which may be indicated by an assertion of a logic one by the fifth logic gate 478.

In example operation, the self-test control logic 405, and/or, more generally, the dual comparator logic 400, may select whether the first comparator logic 402 or the second comparator logic 404 is to test the lockstep functions of the lockstep wrapper 200 of FIG. 2. For example, the self-test control logic 405 may select the first comparator logic 402 to test the lockstep functions. In such examples, the self-test control logic 405 invokes and/or otherwise instructs the first set of multiplexers 420, 422 and the third set of multiplexers 462, 464 to pass inputs from the buses 489, 490 to the first logic gates 428, 430. In some such examples, the self-test control logic 405 may assert a signal at the second input of the fifth logic gate 436 of the first error detection logic 418 to effectuate the test of the lockstep functions. In some examples, the fifth logic gate 436 may output a logic low signal as the FUNC_COMPARE_ERROR1 signal in response to the first logic gates 428, 430 detecting that the inputs from the buses 489, 490 match. In some examples, the fifth logic gate 436 may output a logic high signal as the FUNC_COMPARE_ERROR1 signal in response to the first logic gates 428, 430 detecting that the inputs from the buses 489, 490 do not match.

In example operation, the self-test control logic 405 may select the second comparator logic 404 to execute a self-test, which may include a match test and/or a mismatch test. In such examples, the self-test control logic 405 invokes and/or otherwise instructs the second set of multiplexers 424, 426 and the fourth set of multiplexers 466, 468 to pass inputs from the self-test control logic 405 to the second logic gates 470, 472. In some such examples, the self-test control logic 405 may deassert a signal at the second input of the fifth logic gate 436 of the second error detection logic 460 to effectuate the self-test.

In some examples, the self-test control logic 405 (i) outputs logic zeros (or logic ones) to the second set of multiplexers 424, 426 and the fourth set of multiplexers 466, 468 to perform the match test and (ii) asserts TM2_MATCH_TEST. The sixth logic gate 480 may output a logic low signal to the tenth logic gate 488 in response to the second logic gates 470, 472 not detecting at least one logic one from the second logic gates 470, 472, which indicates a pass of the match test. The sixth logic gate 480 may output a logic high signal to the tenth logic gate 488 in response to the second logic gates 470, 472 detecting at least one logic one from the second logic gates 470, 472, which indicates a failure of the match test.

In some examples, the self-test control logic 405 (i) outputs logic ones to the second set of multiplexers 424, 426 and logic zeros to the fourth set of multiplexers 466, 468 during a first cycle and outputs logic zeros to the second set of multiplexers 424, 426 and logic ones to the fourth set of multiplexers 466, 468 during a second cycle (after the first cycle) to perform the mismatch test and (ii) asserts TM2_MISMATCH_TEST. The sixth logic gate 480 may output a logic low signal to the tenth logic gate 488 in response to the second logic gates 470, 472 not detecting at least one logic one from the second logic gates 470, 472, which indicates a pass or successful completion of the mismatch test. The sixth logic gate 480 may output a logic high signal to the tenth logic gate 488 in response to the second logic gates 470, 472 detecting at least one logic one from the second logic gates 470, 472, which indicates a failure or unsuccessful completion of the mismatch test.

In example operation, in response to at least one of the sixth logic gate 480, the seventh logic gate 482, or the ninth logic gate 486 outputting a logic one, the tenth logic gate 488 may assert a logic one as the SELF-TEST_ERROR2 signal. In some such examples, the assertion of the SELF-TEST_ERROR2 signal indicates a detection of a fault condition of the second comparator logic 402, the indication of which may be stored as the lockstep debug data 220 in the memory 218 of FIG. 2.

In example operation, the self-test control logic 405, and/or, more generally, the dual comparator logic 400, may select (i) the second comparator logic 404 to test the lockstep functions in response to the second comparator logic 404 completing a self-test (e.g., successfully completing a self-test) and (ii) the first comparator logic 402 to execute a self-test. Advantageously, by testing at least one of the first comparator logic 402 or the second comparator logic 404 at a time, the other one of the first comparator logic 402 or the second comparator logic 404 may remain online to test the lockstep associated with the primary hardware 202 and the secondary hardware 204 of FIG. 2.

Figure 5:
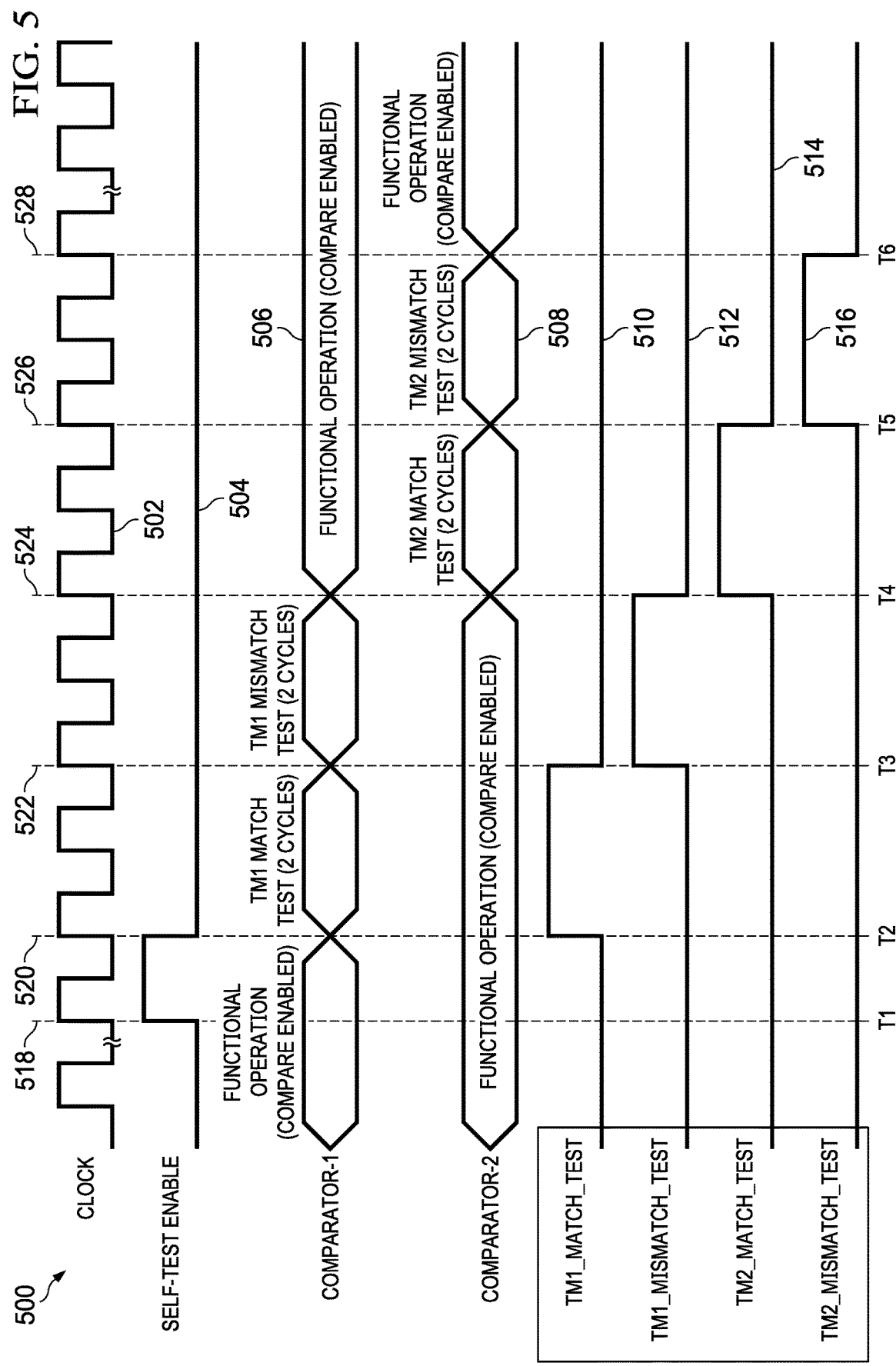
FIG. 5 is a timing diagram depicting example operation of the example lockstep comparator circuitry of FIGS. 1, 2, 3, and/or 4A-4B.

FIG. 5 is a timing diagram 500 depicting example operation of the example LCL 104 of FIG. 1, the lockstep compare-control logic 210 of FIG. 2, the comparator logic 300 of FIG. 3, and/or the dual comparator logic 400 of FIGS. 4A-4B. The timing diagram 500 includes example waveforms 502, 504, 506, 508, 510, 512, 514, 516 including a first example waveform 502, a second example waveform 504, a third example waveform 506, a fourth example waveform 508, a fifth example waveform 510, a sixth example waveform 512, a seventh example waveform 514, and an eighth example waveform 516. In particular, the first waveform 502, the second waveform 504, the third waveform 506, the fifth waveform 510, and/or the sixth waveform 512 may correspond to signals associated with both (i) a single comparator implementation (e.g., the comparator logic 300 of FIG. 3) and (ii) a dual comparator implementation (e.g., the dual comparator logic 400 of FIGS. 4A-4B). In some examples, the fourth waveform 508, the seventh waveform 514, and the eighth waveform 516 may correspond to signals associated with a second comparator in dual comparator examples (e.g., the first comparator logic 402 and/or the second comparator logic 404 of the dual comparator logic 400 of FIGS. 4A-4B).

The first waveform 502 implements a clock signal. For example, the first waveform 502 may implement the clock signals (CLK) received by the first latch 318, the second latch 320, the third latch 340, and/or the fourth latch 342 of FIG. 3. In some examples, the first waveform 502 may implement the clock signals (CLK) received by the first latch 406, the second latch 414, the third latch 416, the fourth latch 448, the fifth latch 456, and/or the sixth latch 458 of FIGS. 4A-4B.

The second waveform 504 implements a self-test enable signal. For example, the self-test enable signal may be implemented by the self-test control logic 212 of FIG. 2, the self-test control logic 322 of FIG. 3, and/or the self-test control logic 405 of FIGS. 4A-4B. In some examples, the self-test enable signal may implement the signal SELF-TEST_MODE depicted in FIG. 3. In some examples, the self-test control logic 212, the self-test control logic 322, and/or the self-test control logic 405 may assert the self-test enable signal to initiate and/or otherwise trigger a self-test of the first comparator logic 214 and/or the second comparator logic 216 of FIG. 2, the comparator logic 300 of FIG. 3, and/or the first comparator logic 402 and/or the second comparator logic 404 of FIGS. 4A-4B.

The third waveform 506 implements operation of first comparator logic, such as the first comparator logic 214 of FIG. 2, the comparator logic 300 of FIG. 3, and/or the first comparator logic 402 of FIGS. 4A-4B. The fourth waveform 508 implements operation of second comparator logic, such as the second comparator logic 216 of FIG. 2, the comparator logic 300 of FIG. 3, and/or the second comparator logic 404 of FIGS. 4A-4B.

The fifth waveform 510 implements a first test mode match signal (TM1_MATCH_TEST). In some examples, the fifth waveform 510 may implement the MATCH_TEST signal of FIG. 3 and/or the TM1_MATCH_TEST signal of FIGS. 4A-4B. The sixth waveform 512 implements a first test mode mismatch signal (TM1_MISMATCH_TEST). In some examples, the sixth waveform 512 may implement the MISMATCH_TEST signal of FIG. 3 and/or the TM1_MISMATCH_TEST signal of FIGS. 4A-4B.

The seventh waveform 514 implements a second test mode match signal (TM2_MATCH_TEST). In some examples, the seventh waveform 514 may implement the MATCH_TEST signal of FIG. 3 and/or the TM2_MATCH_TEST signal of FIGS. 4A-4B. The eighth waveform 516 implements a second test mode mismatch signal (TM2_MISMATCH_TEST). In some examples, the seventh waveform 516 may implement the MISMATCH_TEST signal of FIG. 3 and/or the TM2_MISMATCH_TEST signal of FIGS. 4A-4B.

In the timing diagram 500 of FIG. 5, at a first example time (T1) 518, the self-test control logic 212 may assert the second waveform 504 and deassert the second waveform 504 at a second example time (T2) 520. In response to the deassertion, the self-test control logic 212 asserts the fifth waveform 510 to trigger a match test of the first comparator logic to implement test mode 1. For example, the self-test control logic 212 may assert TM1_MATCH_TEST of FIGS. 4A-4B to effectuate a match test of the first comparator logic 402 from the second time 520 until a third example time (T3) 522 as described above in connection with FIGS. 2, 3, and/or 4A-4B. Advantageously, the first comparator logic 402 may perform a match test of the first comparator logic 402 in two clock cycles of the first waveform 502.

At the third time 522, the self-test control logic 212 deasserts the fifth waveform 510 and asserts the sixth waveform 512 to trigger a mismatch test of the first comparator logic. For example, the self-test control logic 212 may assert TM1_MISMATCH_TEST of FIGS. 4A-4B to effectuate a mismatch test of the first comparator logic 402 from the third time 522 until a fourth example time (T4) 524 as described above in connection with FIGS. 2, 3, and/or 4A-4B to implement test mode 1. Advantageously, the first comparator logic 402 may perform a mismatch test of the first comparator logic 402 in two clock cycles of the first waveform 502. Advantageously, the first comparator logic 402 may perform a self-test (e.g., a match test and a mismatch test) of the first comparator logic 402 in four clock cycles of the first waveform 502.

At the fourth time 524, the self-test control logic 212 deasserts the sixth waveform 512 and asserts the seventh waveform 514 to trigger a match test of the second comparator logic to implement test mode 2. In response to the deassertion of the sixth waveform 512, the self-test of the first comparator logic 402 is complete and may return to functional operation with compare functions enabled. At the fourth time 524, the self-test control logic 212 may assert TM2_MATCH_TEST of FIGS. 4A-4B to effectuate a match test of the second comparator logic 404 from the fourth time 524 until a fifth example time (T5) 526 as described above in connection with FIGS. 2, 3, and/or 4A-4B. Advantageously, the second comparator logic 404 may perform a match test of the second comparator logic 404 in two clock cycles of the first waveform 502.

At the fifth time 526, the self-test control logic 212 deasserts the seventh waveform 514 and asserts the eighth waveform 516 to trigger a mismatch test of the second comparator logic to implement test mode 2. For example, the self-test control logic 212 may assert TM2_MISMATCH_TEST of FIGS. 4A-4B to effectuate a mismatch test of the second comparator logic 404 from the fifth time 526 until a sixth example time (T6) 528 as described above in connection with FIGS. 2, 3, and/or 4A-4B. In response to the deassertion of the eighth waveform 516, the self-test of the second comparator logic 404 is complete and may return to functional operation with compare functions enabled.

Advantageously, the second comparator logic 404 may perform a mismatch test of the second comparator logic 404 in two clock cycles of the first waveform 502. Advantageously, the second comparator logic 404 may perform a self-test (e.g., a match test and a mismatch test) of the second comparator logic 404 in four clock cycles of the first waveform 502. Advantageously, the dual comparator logic 400 of FIGS. 4A-4B may perform an entire self-test (e.g., a match and mismatch test for the first comparator logic 402 and a match and mismatch test for the second comparator logic 404) in eight clock cycles of the first waveform 502.

Figure 6:
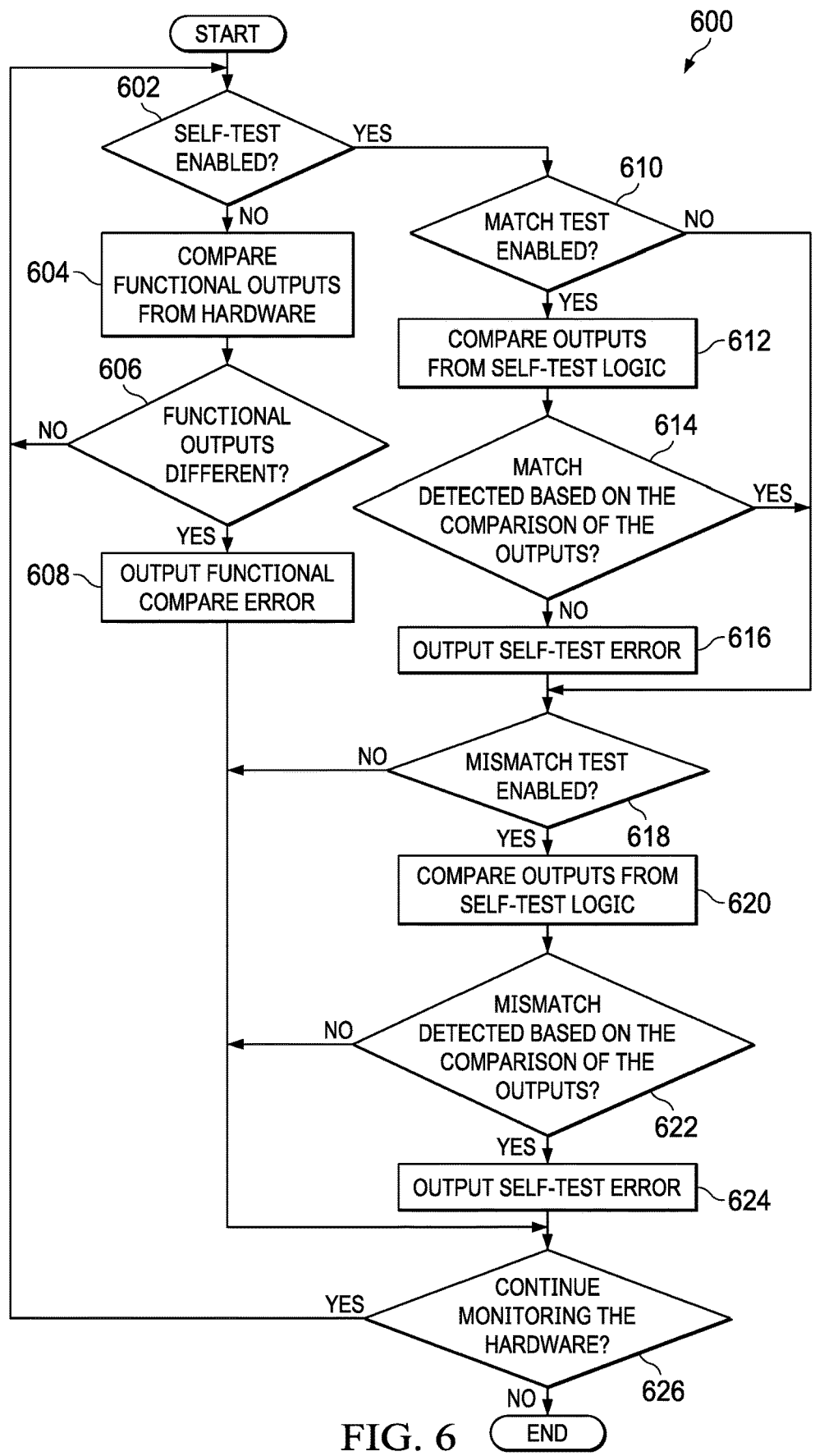
FIG. 6 is a flowchart representative of an example process that may be performed using machine readable instructions that may be executed and/or hardware configured to implement the example lockstep comparator circuitry of FIGS. 1, 2, 3, and/or 4A-4B to detect errors associated with one or more comparators.
Figure 7:
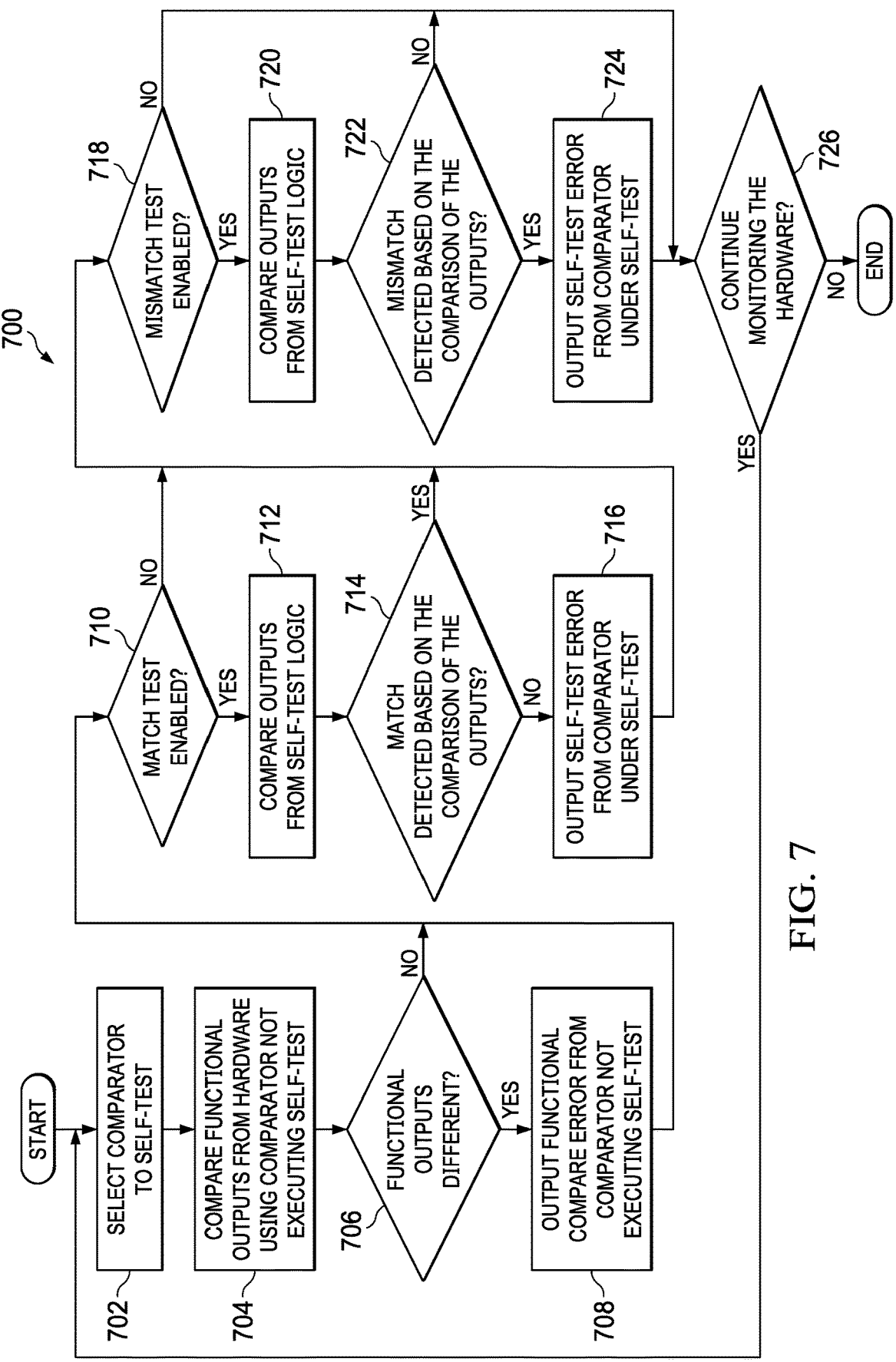
FIG. 7 is another flowchart representative of an example process that may be performed using machine readable instructions that may be executed and/or hardware configured to implement the example lockstep comparator circuitry of FIGS. 1, 2, 3, and/or 4A-4B to detect errors associated with one or more comparators.

Flowcharts representative of example processes, hardware logic, machine readable instructions, hardware implemented state machines, and/or any combination thereof for implementing the example LCL 104 of FIG. 1, the example lockstep wrapper 200 of FIG. 2 or portion(s) thereof, the example comparator logic 300 of FIG. 3, and/or the example dual comparator logic 400 of FIGS. 4A-4B are shown in FIGS. 6-7. The processes and/or machine readable instructions may be one or more executable programs or portion(s) of an executable program for execution by a computer processor and/or processor circuitry, such as the processor 812 shown in the example processor platform 800 discussed below in connection with FIG. 8. The program may be embodied in software stored on a non-transitory computer readable storage medium such as a CD-ROM, a floppy disk, a hard drive, a DVD, a Blu-ray disk, or a memory associated with the processor 812, but the entire program and/or parts thereof could alternatively be executed by a device other than the processor 812 and/or embodied in firmware or dedicated hardware. Further, although the example program is described with reference to the flowcharts illustrated in FIGS. 6-7, many other methods of implementing the example LCL 104 of FIG. 1, the example lockstep wrapper 200 of FIG. 2 or portion(s) thereof, the example comparator logic 300 of FIG. 3, and/or the example dual comparator logic 400 of FIGS. 4A-4B may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more devices (e.g., a multi-core processor in a single machine, multiple processors distributed across a server rack, etc.).

The machine readable instructions described herein may be stored in one or more of a compressed format, an encrypted format, a fragmented format, a compiled format, an executable format, a packaged format, etc. Machine readable instructions as described herein may be stored as data or a data structure (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers) located at the same or different locations of a network or collection of networks (e.g., in the cloud, in edge devices, etc.). The machine readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement one or more functions that may together form a program such as that described herein.

In another example, the machine readable instructions may be stored in a state in which they may be read by processor circuitry, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, machine readable media, as used herein, may include machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example processes of FIGS. 6-7 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

FIG. 6 is a flowchart representative of an example process 600 that may be performed using machine readable instructions that may be executed and/or hardware configured to implement the LCL 104 of FIG. 1, the lockstep wrapper 200 of FIG. 2 or portion(s) thereof, the comparator logic 300 of FIG. 3, and/or the dual comparator logic 400 of FIGS. 4A-4B to detect errors associated with at least one comparator.

The process 600 begins at block 602, at which the comparator logic 300 of FIG. 3 determines whether a self-test is enabled. For example, the selection logic 304 may determine that a self-test is enabled in response to a signal from the self-test control logic 322 indicative that a self-test is to be executed.

If, at block 602, the comparator logic 300 determines that a self-test has not been enabled, control proceeds to block 604 to compare functional outputs from hardware. For example, the first logic gates 332, 334 of FIG. 3 may compare outputs from the primary module 202 and the secondary module 204 of FIG. 2.

At block 606, the comparator logic 300 determines whether the functional outputs are different. For example, the fifth logic gate 344 may assert a logic high as FUNC_COMPARE_ERROR of FIG. 3 in response to inputs from the first bus 314 and the second bus 316 being different. In some examples, the fifth logic gate 344 may output a logic low as FUNC_COMPARE_ERROR in response to inputs from the first bus 314 and the second bus 316 being the same.

If, at block 606, the comparator logic 300 determines that the functional outputs are not different, control returns to block 602 to determine whether the self-test is enabled. If, at block 606, the comparator logic 300 determines that the functional outputs are different, then, at block 608, the comparator logic 300 outputs a functional compare error. For example, an indication of a fault condition in response to FUNC_COMPARE_ERROR being asserted to a logic high may be stored in the memory 218 of FIG. 2. In some examples, a resource of the computing system 102 of FIG. 2 may generate an alert indicative of the fault condition. For example, the user interface 124 may display the alert, the interface resource 114 may transmit the alert to the central facility 128 via the network 126 of FIG. 1, etc., and/or a combination thereof. In response to outputting the functional compare error at block 608, the process 600 of FIG. 6 concludes.

If, at block 602, the comparator logic 300 determines that a self-test is enabled, control proceeds to block 610 to determine whether a match test is enabled. For example, the selection logic 304 and/or the error detection logic 312 may determine that a match test is enabled in response to a selection signal and/or an assertion of MATCH_TEST of FIG. 3 from the self-test control logic 322.

If, at block 610, the comparator logic 300 determines that a match test is not enabled, control proceeds to block 618 to determine whether a mismatch test is enabled. If, at block 610, the comparator logic 300 determines that a match test is enabled, then, at block 612, the comparator logic 300 compares outputs from self-test logic. For example, the self-test control logic 322 may output logic zeros to the multiplexers 324, 326, 328, 330 during a first cycle, a first time period, etc. In such examples, the first logic gates 332, 334 may compare the outputs from the multiplexers 324, 326, 328, 330 to determine whether a match is detected. In some such examples, the self-test control logic 322 may output logic ones to the multiplexers 324, 326, 328, 330 during a second cycle (after the first cycle), a second time period (after the first time period), etc. In such examples, the first logic gates 332, 334 may compare the outputs from the multiplexers 324, 326, 328, 330 to determine whether a match is detected.

At block 614, the comparator logic 300 determines whether a match is detected based on the comparison of the outputs. For example, the third logic gate 336 may determine whether at least one logic one has been outputted from one(s) of the first logic gates 332, 334 during the first cycle. In such examples, the sixth logic gate 346 may output a logic high to the eighth logic gate 350 in response to the third logic gate 336 determining that at least one logic one has been outputted from the one(s) of the first logic gates 332, 334. In some such examples, the third logic gate 336 may determine whether at least one logic zero has been outputted from one(s) of the first logic gates 332, 334 during the second cycle. In such examples, the sixth logic gate 346 may output a logic high to the eighth logic gate 350 in response to the third logic gate 336 determining that at least one logic zero has been outputted from the one(s) of the first logic gates 332, 334.

If, at block 614, the comparator logic 300 determines that a match is detected based on the comparison of the outputs, control proceeds to block 618 to determine whether a mismatch test is enabled. If, at block 614, the comparator logic 300 determines that a match is not detected based on the comparison of the outputs, then, at block 616, the comparator logic 300 outputs a self-test error. For example, the eighth logic gate 350 may assert a logic high as the SELF-TEST_ERROR output of FIG. 3. In some examples, a fault indication of a self-test error, a program counter value associated with the self-test error, etc., may be stored in the memory 218 as the lockstep debug data 220. In some examples, a resource of the computing system 102 of FIG. 2 may generate an alert indicative of the self-test error. For example, the user interface 124 may display the alert, the interface resource 114 may transmit the alert to the central facility 128 via the network 126 of FIG. 1, etc., and/or a combination thereof.

In response to outputting the self-test error at block 616, the comparator logic 300 determines whether a mismatch test is enabled at block 618. For example, the selection logic 304 and/or the error detection logic 312 may determine that a mismatch test is enabled in response to a selection signal and/or an assertion of MISMATCH_TEST of FIG. 3 from the self-test control logic 322.

If, at block 618, the comparator logic 300 determines that a mismatch test is not enabled, control proceeds to block 626 to determine whether to continue monitoring the hardware. If, at block 618, the comparator logic 300 determines that a mismatch test is enabled, then, at block 620, the comparator logic 300 compares outputs from the self-test logic. For example, the self-test control logic 322 may output logic ones to the first portion of the multiplexers 324, 326, 328, 330 and output logic zeros to the second portion of the multiplexers 324, 326, 328, 330 during a first cycle. In such examples, the first logic gates 332, 334 may compare the outputs from the multiplexers 324, 326, 328, 330 to determine whether a mismatch is detected. In some such examples, the self-test control logic 322 may output logic zeros to the first portion of the multiplexers 324, 326, 328, 330 and output logic ones to the second portion of the multiplexers 324, 326, 328, 330 during a second cycle after the first cycle. In such examples, the first logic gates 332, 334 may compare the outputs from the multiplexers 324, 326, 328, 330 to determine whether a mismatch is detected.

At block 622, the comparator logic 300 determines whether a mismatch is detected based on the comparison of the outputs. For example, the fourth logic gate 338 may determine whether at least one logic zero has been outputted from one(s) of the first logic gates 332, 334 during the first cycle, the second cycle, etc. In such examples, the seventh logic gate 348 may output a logic high to the eighth logic gate 350 in response to the fourth logic gate 338 determining that at least one logic zero has been outputted from the one(s) of the first logic gates 332, 334 during the first cycle, the second cycle, etc.

If, at block 622, the comparator logic 300 determines that a mismatch has not been detected based on the comparison of the outputs, control proceeds to block 626 to determine whether to continue monitoring the hardware. If, at block 622, the comparator logic 300 determines that a mismatch is detected based on the comparison of the outputs, then, at block 624, the comparator logic 300 outputs a self-test error. For example, the eighth logic gate 350 may assert a logic high as the SELF-TEST ERROR output of FIG. 3. In some examples, a fault indication of a self-test error, a program counter value associated with the self-test error, etc., may be stored in the memory 218 as the lockstep debug data 220. In some examples, a resource of the computing system 102 of FIG. 2 may generate an alert indicative of the self-test error. For example, the user interface 124 may display the alert, the interface resource 114 may transmit the alert to the central facility 128 via the network 126 of FIG. 1, etc., and/or a combination thereof.

In response to the comparator logic 300 outputting the self-test error at block 624, the comparator logic 300 determines whether to continue monitoring the hardware at block 626. If, at block 626, the comparator logic 300 determines to continue monitoring the hardware, control returns to block 602 to determine whether a self-test is enabled, otherwise the process 600 of FIG. 6 concludes.

FIG. 7 is another flowchart representative of an example process 700 that may be performed using machine readable instructions that may be executed and/or hardware configured to implement the LCL 104 of FIG. 1, the lockstep wrapper 200 of FIG. 2 or portion(s) thereof, and/or the dual comparator logic 400 of FIGS. 4A-4B to detect errors associated with at least two comparators.

The process 700 begins at block 702, at which the dual comparator logic 400 of FIGS. 4A-4B identifies the comparator under self-test. For example, the first selection logic 408 may identify that the first comparator logic 402 is under self-test in response to a signal from the self-test control logic 405 of FIGS. 4A-4B, which may indicate that the first comparator logic 402 is to perform a self-test (e.g., a match test, a mismatch test, etc.).

At block 704, the dual comparator logic 400 compares functional outputs from hardware using comparator not executing self-test. For example, the second logic gates 470 may compare outputs from the primary module 202 and the secondary module 204 of FIG. 2.

At block 706, the dual comparator logic 400 determines whether the functional outputs are different. For example, the fifth logic gate 478 may assert a logic high as FUNC_COMPARE_ERROR2 of FIGS. 4A-4B in response to inputs from the first bus 489 and the second bus 490 being different. In some examples, the fifth logic gate 478 may output a logic low as FUNC_COMPARE_ERROR2 in response to inputs from the first bus 489 and the second bus 490 being the same.

If, at block 706, the dual comparator logic 400 determines that the functional outputs are not different, control proceeds to block 710 to determine whether a match test is enabled. If, at block 706, the dual comparator logic 400 determines that the functional outputs are different, then, at block 708, the dual comparator logic 400 outputs a functional compare error from the comparator not executing a self-test. For example, an indication of a fault condition in response to FUNC_COMPARE_ERROR2 being asserted to a logic high may be stored in the memory 218 of FIG. 2. In some examples, a resource of the computing system 102 of FIG. 2 may generate an alert indicative of the fault condition. For example, the user interface 124 may display the alert, the interface resource 114 may transmit the alert to the central facility 128 via the network 126 of FIG. 1, etc., and/or a combination thereof.

In response to outputting the functional compare error at block 708, control proceeds to block 710 to determine whether a match test is enabled. For example, the first selection logic 408 and/or the first error detection logic 418 may determine that a match test is enabled in response to a selection signal and/or an assertion of TM1_MATCH_TEST of FIGS. 4A-4B from the self-test control logic 405.

If, at block 710, the dual comparator logic 400 determines that a match test is not enabled, control proceeds to block 718 to determine whether a mismatch test is enabled. If, at block 710, the dual comparator logic 400 determines that a match test is enabled, then, at block 712, the dual comparator logic 400 compares outputs from self-test logic. For example, the self-test logic 405 may output logic zeros to the first set of multiplexers 420, 422 and the third set of multiplexers 462, 464 during a first cycle, a first time period, etc. In such examples, the first logic gates 428, 430 may compare the outputs from the first set of multiplexers 420, 422 and the third set of multiplexers 462, 464 to determine whether a match is detected. In some such examples, the self-test logic 405 may output logic ones to the first set of multiplexers 420, 422 and the third set of multiplexers 462, 464 during a second cycle after the first cycle, a second time period after the first time period, etc. In such examples, the first logic gates 428, 430 may compare the outputs from the first set of multiplexers 420, 422 and the third set of multiplexers 462, 464 to determine whether a match is detected.

At block 714, the dual comparator logic 400 determines whether a match is detected based on the comparison of the outputs. For example, the third logic gate 432 may determine whether at least one logic one has been outputted from one(s) of the first logic gates 428, 430, which may indicate that a match has not been detected. In such examples, the sixth logic gate 438 may output a logic high to the tenth logic gate 446 in response to the third logic gate 432 determining that at least one logic one has been outputted from the one(s) of the first logic gates 428, 430.

If, at block 714, the dual comparator logic 400 determines that a match is detected based on the comparison of the outputs, control proceeds to block 718 to determine whether a mismatch test is enabled. If, at block 714, the dual comparator logic 400 determines that a match has not been detected based on the comparison of the outputs, then, at block 716, the dual comparator logic 400 outputs a self-test error from the comparator under self-test. For example, the tenth logic gate 446 may assert a logic high as the SELF-TEST_ERROR1 output of FIG. 3. In some examples, a fault indication of a self-test error, a program counter value associated with the self-test error, etc., may be stored in the memory 218 as the lockstep debug data 220. In some examples, a resource of the computing system 102 of FIG. 2 may generate an alert indicative of the self-test error. For example, the user interface 124 may display the alert, the interface resource 114 may transmit the alert to the central facility 128 via the network 126 of FIG. 1, etc., and/or a combination thereof.

In response to outputting the self-test error from the comparator under self-test at block 716, the dual comparator logic 400 determines whether a mismatch test is enabled at block 718. For example, the first selection logic 408 and/or the first error detection logic 418 may determine that a mismatch test is enabled in response to a selection signal and/or an assertion of TM1_MISMATCH_TEST of FIGS. 4A-4B from the self-test control logic 405.

If, at block 718, the dual comparator logic 400 determines that a mismatch test is not enabled, control proceeds to block 726 to determine whether to continue monitoring the hardware. If, at block 718, the dual comparator logic 400 determines that a mismatch test is enabled, then, at block 720, the dual comparator logic 400 compares outputs from the self-test logic. For example, the self-test logic 405 may output logic ones to the first set of multiplexers 420, 422 and logic zeros to the third set of multiplexers 462, 464 during a first cycle, a first time period, etc. In such examples, the first logic gates 428, 430 may compare the outputs from the first set of multiplexers 420, 422 and the third set of multiplexers 462, 464 to determine whether a mismatch is detected. In some such examples, the self-test logic 405 may output logic zeros to the first set of multiplexers 420, 422 and logic ones to the third set of multiplexers 462, 464 during a second cycle after the first cycle, a second time period after the first time period, etc. In such examples, the first logic gates 428, 430 may compare the outputs from the first set of multiplexers 420, 422 and the third set of multiplexers 462, 464 to determine whether a mismatch is detected.

At block 722, the dual comparator logic 400 determines whether a mismatch is detected based on the comparison of the outputs. For example, the fourth logic gate 434 may determine whether at least one logic zero has been outputted from one(s) of the first logic gates 428, 430, which may indicate that a mismatch is detected. In such examples, the seventh logic gate 440 may output a logic high to the tenth logic gate 446 in response to the fourth logic gate 434 determining that at least one logic zero has been outputted from the one(s) of the first logic gates 428, 430.

If, at block 722, the dual comparator logic 400 determines that a mismatch is not detected based on the comparison of the outputs, control proceeds to block 726 to determine whether to continue monitoring the hardware. If, at block 722, the dual comparator logic 400 determines that a mismatch is detected based on the comparison of the outputs, then, at block 724, the dual comparator logic 400 outputs a self-test error from the comparator under self-test. For example, the tenth logic gate 446 may assert a logic high as the SELF-TEST_ERROR1 output of FIGS. 4A-4B. In some examples, a fault indication of a self-test error, a program counter value associated with the self-test error, etc., may be stored in the memory 218 as the lockstep debug data 220. In some examples, a resource of the computing system 102 of FIG. 2 may generate an alert indicative of the self-test error. For example, the user interface 124 may display the alert, the interface resource 114 may transmit the alert to the central facility 128 via the network 126 of FIG. 1, etc., and/or a combination thereof.

In response to outputting the self-test error from the comparator under self-test at block 724, the dual comparator logic 400 determines whether to continue monitoring the hardware. If, at block 726, the dual comparator logic 400 determines to continue monitoring the hardware, control returns to block 702 to select a comparator to self-test, otherwise the process 700 of FIG. 7 concludes.

Figure 8:
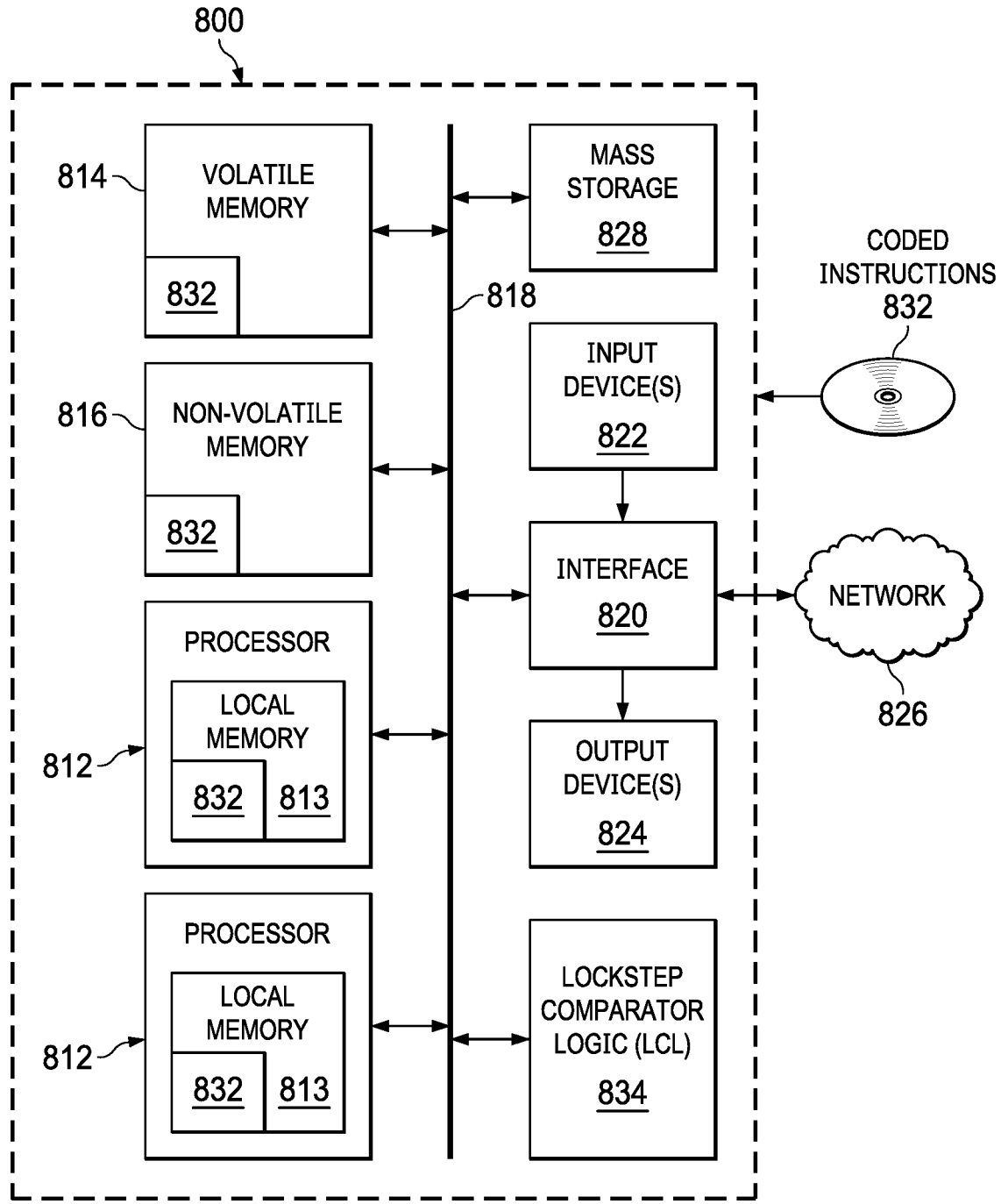
FIG. 8 is a block diagram of an example processing platform structured to execute the example process of FIGS. 6 and/or 7 to implement the example lockstep comparator circuitry of FIGS. 1, 2, 3, and/or 4A-4B.

FIG. 8 is a block diagram of an example processor platform 800 structured to execute the instructions of FIGS. 6-7 to implement the LCL 104 of FIG. 1, the lockstep wrapper 200 of FIG. 2 or portion(s) thereof, the comparator logic 300 of FIG. 3, and/or the dual comparator logic 400 of FIGS. 4A-4B. The processor platform 800 can be, for example, an electronic control unit of a vehicle, a server, a personal computer, a workstation, a self-learning machine (e.g., a neural network), a gaming console, or any other type of computing device.

The processor platform 800 of the illustrated example includes two processors 812. The two processors 812 of the illustrated example are hardware. For example, the processors 812 can be implemented by one or more integrated circuits, logic circuits, microprocessors, GPUs, DSPs, or controllers from any desired family or manufacturer. The hardware processors may be a semiconductor based (e.g., silicon based) device.

The processors 812 of the illustrated example includes a local memory 813 (e.g., a cache). The processors 812 of the illustrated example are in communication with a main memory including a volatile memory 814 and a non-volatile memory 816 via a bus 818. The volatile memory 814 may be implemented by one or more flip-flops, Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 816 may be implemented by flash memory and/or any other desired type of memory device. Access to the main memory 814, 816 is controlled by a memory controller.

The processor platform 800 of the illustrated example also includes an interface circuit 820. The interface circuit 820 may be implemented by any type of interface standard, such as an Ethernet interface, a universal serial bus (USB), a Bluetooth® interface, a near field communication (NFC) interface, and/or a PCI express interface.

In the illustrated example, one or more input devices 822 are connected to the interface circuit 820. The input device(s) 822 permit(s) a user to enter data and/or commands into the processor 812. The input device(s) can be implemented by, for example, an audio sensor, a microphone, a camera (still or video), a keyboard, a button, a mouse, a touchscreen, a track-pad, a trackball, an isopoint device, and/or a voice recognition system.

One or more output devices 824 are also connected to the interface circuit 820 of the illustrated example. The output devices 824 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer and/or speaker. The interface circuit 820 of the illustrated example, thus, typically includes a graphics driver card, a graphics driver chip and/or a graphics driver processor.

The interface circuit 820 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 826. The communication can be via, for example, an Ethernet connection, a digital subscriber line (DSL) connection, a telephone line connection, a coaxial cable system, a satellite system, a line-of-site wireless system, a cellular telephone system, etc.

The processor platform 800 of the illustrated example also includes one or more mass storage devices 828 for storing software and/or data. Examples of such mass storage devices 828 include floppy disk drives, hard drive disks, compact disk drives, Blu-ray disk drives, redundant array of independent disks (RAID) systems, and digital versatile disk (DVD) drives.

The machine executable instructions 832 of FIGS. 6-7 may be stored in the mass storage device 828, in the volatile memory 814, in the non-volatile memory 816, and/or on a removable non-transitory computer readable storage medium such as a CD or DVD.

An example LCL 834 is coupled to one(s) of the processors 812, the volatile memory 814, the non-volatile memory 816, the interface 820, and/or the one or more mass storage devices 828 via the bus 818. In some examples, the LCL 834 may be implemented by the LCL 104 of FIG. 1, the lockstep wrapper 200 of FIG. 2 or portion(s) thereof, the comparator logic 300 of FIG. 3, and/or the dual comparator logic 400 of FIGS. 4A-4B. For example, the LCL 834 may test the lockstep of the processors 812. In some examples, the LCL 834 may self-test one or more comparators included in and/or otherwise implemented by the LCL 834 as described herein.

From the foregoing, it will be appreciated that example methods, apparatus, and articles of manufacture have been described that implement lockstep comparators. Advantageously, the example methods, apparatus, and articles of manufacture described herein may implement dual comparators with online test sequencing. For example, the example methods, apparatus, and articles of manufacture described herein may implement smart redundancy of a comparator utilized to test the lockstep of two or more hardware resources. Advantageously, the example methods, apparatus, and articles of manufacture described herein may implement diagnostics to minimize and/or otherwise reduce a self-test time of a lockstep comparator to eight cycles independent of the number of signals being compared.

Advantageously, the example methods, apparatus, and articles of manufacture described herein may freeze a compare state of the one or more lockstep comparators in response to a detection of miscompare and may make the compare state (among other debug data such as an associated program counter value) readable and/or otherwise available to an application and/or other hardware resource. Advantageously, the example methods, apparatus, and articles of manufacture described herein may effectuate lockstep to always be enabled even during self-test execution of the one or more lockstep comparators. For example, the example methods, apparatus, and articles of manufacture described herein may perform the self-test of lockstep during application execution without compromising application integrity.

Example methods, apparatus, systems, and articles of manufacture to implement lockstep comparators are described herein. Further examples and combinations thereof include the following:

Example 1 includes an apparatus comprising self-test logic circuitry having first outputs, and comparator logic including selection logic having first inputs and second outputs, ones of the first inputs coupled to the first outputs, first detection logic having second inputs and third outputs, the second inputs coupled to the second outputs, second detection logic having third inputs and fourth outputs, the third inputs coupled to the third outputs, latch logic having fifth inputs and fifth outputs, the third output and the fourth output coupled to the fifth inputs, and error detection logic having sixth inputs coupled to the fifth inputs.

Example 2 includes the apparatus of example 1, wherein the selection logic includes a plurality of multiplexers, ones of the plurality of the multiplexers having a respective one of the first inputs and a respective one of the second outputs.

Example 3 includes the apparatus of example 2, further including a first latch having a seventh input and a sixth output, the seventh input to be coupled to one or more seventh outputs of a first processor, and a second latch having an eighth input and an eighth output, the eight input to be coupled to one or more ninth outputs of a second processor, the first processor to be configured to operate in lockstep with the second processor.

Example 4 includes the apparatus of example 3, wherein the sixth output is coupled to respective ones of the first inputs of a first set of the plurality of the multiplexers and the eighth output is coupled to respective ones of the second inputs of a second set of the plurality of the multiplexers, the first set different from the second set.

Example 5 includes the apparatus of example 1, wherein the first detection logic includes a plurality of logic gates having the second inputs and the third outputs.

Example 6 includes the apparatus of example 5, wherein ones of the plurality of the logic gates are exclusive or logic gates.

Example 7 includes the apparatus of example 1, wherein the latch logic includes a first latch having a seventh input and a sixth output, the seventh input coupled to the second detection logic, the sixth output coupled to the error detection logic, and a second latch having an eighth input and a seventh output, the eighth input coupled to the second detection logic, the seventh output coupled to the error detection logic.

Example 8 includes the apparatus of example 7, wherein the second detection logic includes a first logic gate and a second logic gate, the first logic gate and the second logic gate having ones of the third inputs and the fourth outputs, the seventh input coupled to the first logic gate through a first one of the fourth outputs, the eighth input coupled to the second logic gate through a second one of the fourth outputs.

Example 9 includes the apparatus of example 8, wherein the first logic gate is an OR logic gate and the second logic gate is a NAND logic gate.

Example 10 includes the apparatus of example 7, wherein the error detection logic includes a first logic gate having a ninth input, the ninth input coupled to the sixth output, a second logic gate having a tenth input and a ninth output, the tenth input coupled to the sixth output, a third logic gate having an eleventh input and a tenth output, the eleventh input coupled to the seventh output, and a fourth logic gate having a twelfth input and a thirteenth input, the twelfth input coupled to the ninth output, the thirteenth input coupled to the tenth output.

Example 11 includes the apparatus of example 10, wherein the first logic gate, the second logic gate, and the third logic gate are AND logic gates, and the fourth logic gate is an OR logic gate.

Example 12 includes the apparatus of example 1, wherein the latch logic is first latch logic, further including second latch logic, the selection logic coupled to a first processor and a second processor through the second latch logic, and the self-test logic circuitry is to in response to a first control signal, instruct the error detection logic to test whether a first processor output from the first processor matches a second processor output from the second processor, and in response to a second control signal, instruct the error detection logic to self-test the first detection logic.

Example 13 includes the apparatus of example 12, wherein the self-test includes a first self-test and a second self-test, and the self-test logic circuitry is to invoke the first self-test to execute in two clock cycles, and invoke the second self-test to execute in two clock cycles, the first detection logic to execute the self-test in four clock cycles based on the first self-test and the second self-test.

Example 14 includes the apparatus of example 12, wherein the error detection logic is to identify a first fault condition in response to determining that the first processor output does not match the second processor output, identify a second fault condition in response to a failure of the self-test, and in response to an identification of at least one of the first fault condition or the second fault condition, transmit lockstep debug data to a user interface, the lockstep debug data including at least one of port information or program counter information associated with at least one of the first fault condition or the second fault condition.

Example 15 includes an apparatus comprising first comparator logic configured to receive a first input from a first processor and a second input from a second processor, second comparator logic coupled to the first comparator logic, the second comparator logic configured to receive the first input and the second input, and self-test logic circuitry coupled to the first comparator logic and the second comparator logic, the self-test logic circuitry to, in response to one or more first control signals instruct the first comparator logic to compare the first input and the second input, and instruct the second comparator logic to perform a self-test of the second comparator logic.

Example 16 includes the apparatus of example 15, wherein the self-test logic circuitry is to, in response to generating one or more second control signals instruct the first comparator logic to perform a self-test of the first comparator logic, and instruct the second comparator logic to compare a third input of the first processor and a fourth input of the second processor, the first processor to be configured to operate in lockstep with the second processor.

Example 17 includes the apparatus of example 15, wherein the first comparator logic includes selection logic, first detection logic coupled to the selection logic, second detection logic coupled to the first detection logic, a first latch coupled to the second detection logic, a second latch coupled to the second detection logic, and error detection logic coupled to the first latch and the second latch.

Example 18 includes the apparatus of example 17, wherein the selection logic is first selection logic, and the second comparator logic includes second selection logic, the second selection logic coupled to the first detection logic.

Example 19 includes the apparatus of example 17, wherein the first latch has a first input and a first output, the second latch has a second input and a second output, and the error detection logic includes a first logic gate having a third input and a third output, the third input coupled to the first output, a second logic gate having a fourth input and a fourth output, the fourth input coupled to the first output, a third logic gate having a fifth input and a fifth output, the fifth input coupled to the second output, and a fourth logic gate having a sixth input, a seventh input, and a sixth output, the sixth input coupled to the fourth output, the seventh input coupled to the fifth output.

Example 20 includes the apparatus of example 19, wherein at least one of the third output or the sixth output are coupled to memory.

Example 21 includes a system comprising first processor hardware having first outputs, second processor hardware having second outputs, and lockstep control logic including first comparator logic having third inputs and fourth inputs, the third inputs coupled to the first outputs, second comparator logic having fifth inputs and sixth inputs, the fifth inputs coupled to the second outputs, and self-test control logic having third outputs and fourth outputs, the third outputs coupled to the fourth inputs, the fourth outputs coupled to the sixth inputs.

Example 22 includes the system of example 21, wherein the self-test control logic is to execute a first self-test of the first comparator logic in two clock cycles, execute a second self-test of the first comparator logic in two clock cycles, execute the first self-test of the second comparator logic in two clock cycles, and execute the second self-test of the second comparator logic in two clock cycles.

Example 23 includes the system of example 21, wherein the self-test control logic is to generate one or more control signals to instruct the first comparator logic to compare the first outputs and the second outputs, and instruct the second comparator logic to perform a self-test of the second comparator logic.

Example 24 includes the system of example 23, wherein the one or more control signals are one or more first control signals, and the self-test control logic is to generate one or more second control signals to instruct the first comparator logic to perform a self-test of the first comparator logic, and instruct the second comparator logic to compare fifth outputs of the first processor hardware and sixth outputs of the second processor hardware, the first processor hardware to be configured to operate in lockstep with the second processor hardware.

Example 25 includes the system of example 23, wherein the first comparator logic is to identify a first fault condition in response to determining that one or more of the first outputs do not match one or more of the second outputs, and in response to an identification of the first fault condition, transmit first lockstep debug data to a user interface, the first lockstep debug data including at least one of first port information or first program counter information associated with the first fault condition, and the second comparator logic is to identify a second fault condition in response to a failure of the self-test, and in response to an identification of the second fault condition, transmit second lockstep debug data to the user interface, the second lockstep debug data including at least one of second port information or second program counter information associated with the second fault condition.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus comprising:
   self-test logic circuitry having first outputs; and
   comparator logic including:
      selection logic having first inputs and second outputs, ones of the first inputs coupled to the first outputs;
      first detection logic having second inputs and third outputs, the second inputs coupled to the second outputs;
      second detection logic having third inputs and fourth outputs, the third inputs coupled to the third outputs;
      latch logic having fifth inputs and fifth outputs, the third output and the fourth output coupled to the fifth inputs; and
      error detection logic having sixth inputs coupled to the fifth inputs.

2. The apparatus of claim 1, wherein the selection logic includes a plurality of multiplexers, ones of the plurality of the multiplexers having a respective one of the first inputs and a respective one of the second outputs.

3. The apparatus of claim 2, further including:
   a first latch having a seventh input and a sixth output, the seventh input to be coupled to one or more seventh outputs of a first processor; and
   a second latch having an eighth input and an eighth output, the eight input to be coupled to one or more ninth outputs of a second processor, the first processor to be configured to operate in lockstep with the second processor.

4. The apparatus of claim 3, wherein the sixth output is coupled to respective ones of the first inputs of a first set of the plurality of the multiplexers and the eighth output is coupled to respective ones of the second inputs of a second set of the plurality of the multiplexers, the first set different from the second set.

5. The apparatus of claim 1, wherein the first detection logic includes a plurality of logic gates having the second inputs and the third outputs.

6. The apparatus of claim 5, wherein ones of the plurality of the logic gates are exclusive or logic gates.

7. The apparatus of claim 1, wherein the latch logic includes:
   a first latch having a seventh input and a sixth output, the seventh input coupled to the second detection logic, the sixth output coupled to the error detection logic; and
   a second latch having an eighth input and a seventh output, the eighth input coupled to the second detection logic, the seventh output coupled to the error detection logic.

8. The apparatus of claim 7, wherein the second detection logic includes a first logic gate and a second logic gate, the first logic gate and the second logic gate having ones of the third inputs and the fourth outputs, the seventh input coupled to the first logic gate through a first one of the fourth outputs, the eighth input coupled to the second logic gate through a second one of the fourth outputs.

9. The apparatus of claim 8, wherein the first logic gate is an OR logic gate and the second logic gate is a NAND logic gate.

10. The apparatus of claim 7, wherein the error detection logic includes:
    a first logic gate having a ninth input, the ninth input coupled to the sixth output;
    a second logic gate having a tenth input and a ninth output, the tenth input coupled to the sixth output;
    a third logic gate having an eleventh input and a tenth output, the eleventh input coupled to the seventh output; and
    a fourth logic gate having a twelfth input and a thirteenth input, the twelfth input coupled to the ninth output, the thirteenth input coupled to the tenth output.

11. The apparatus of claim 10, wherein the first logic gate, the second logic gate, and the third logic gate are AND logic gates, and the fourth logic gate is an OR logic gate.

12. The apparatus of claim 1, wherein the latch logic is first latch logic, further including second latch logic, the selection logic coupled to a first processor and a second processor through the second latch logic, and the self-test logic circuitry is to:
  in response to a first control signal, instruct the error detection logic to test whether a first processor output from the first processor matches a second processor output from the second processor; and
  in response to a second control signal, instruct the error detection logic to self-test the first detection logic.

13. The apparatus of claim 12, wherein the self-test includes a first self-test and a second self-test, and the self-test logic circuitry is to:
  invoke the first self-test to execute in two clock cycles; and
  invoke the second self-test to execute in two clock cycles, the first detection logic to execute the self-test in four clock cycles based on the first self-test and the second self-test.

14. The apparatus of claim 12, wherein the error detection logic is to:
  identify a first fault condition in response to determining that the first processor output does not match the second processor output;
  identify a second fault condition in response to a failure of the self-test; and
  in response to an identification of at least one of the first fault condition or the second fault condition, transmit lockstep debug data to a user interface, the lockstep debug data including at least one of port information or program counter information associated with at least one of the first fault condition or the second fault condition.

15. An apparatus comprising:
  first comparator logic configured to receive a first input from a first processor and a second input from a second processor;
  second comparator logic coupled to the first comparator logic, the second comparator logic configured to receive the first input and the second input; and
  self-test logic circuitry coupled to the first comparator logic and the second comparator logic, the self-test logic circuitry to, in response to one or more first control signals:
    instruct the first comparator logic to compare the first input and the second input; and
    instruct the second comparator logic to perform a self-test of the second comparator logic.

16. The apparatus of claim 15, wherein the self-test logic circuitry is to, in response to generating one or more second control signals:
  instruct the first comparator logic to perform a self-test of the first comparator logic; and
  instruct the second comparator logic to compare a third input of the first processor and a fourth input of the second processor, the first processor to be configured to operate in lockstep with the second processor.

17. The apparatus of claim 15, wherein the first comparator logic includes:
  selection logic;
  first detection logic coupled to the selection logic;
  second detection logic coupled to the first detection logic;
  a first latch coupled to the second detection logic;
  a second latch coupled to the second detection logic; and
  error detection logic coupled to the first latch and the second latch.

18. The apparatus of claim 17, wherein the selection logic is first selection logic, and the second comparator logic includes second selection logic, the second selection logic coupled to the first detection logic.

19. The apparatus of claim 17, wherein the first latch has a first input and a first output, the second latch has a second input and a second output, and the error detection logic includes:
  a first logic gate having a third input and a third output, the third input coupled to the first output;
  a second logic gate having a fourth input and a fourth output, the fourth input coupled to the first output;
  a third logic gate having a fifth input and a fifth output, the fifth input coupled to the second output; and
  a fourth logic gate having a sixth input, a seventh input, and a sixth output, the sixth input coupled to the fourth output, the seventh input coupled to the fifth output.

20. The apparatus of claim 19, wherein at least one of the third output or the sixth output are coupled to memory.

21. A system comprising:
  first processor hardware having first outputs;
  second processor hardware having second outputs; and
  lockstep control logic including:
    first comparator logic having third inputs and fourth inputs, the third inputs coupled to the first outputs;
    second comparator logic having fifth inputs and sixth inputs, the fifth inputs coupled to the second outputs; and
    self-test control logic having third outputs and fourth outputs, the third outputs coupled to the fourth inputs, the fourth outputs coupled to the sixth inputs.

22. The system of claim 21, wherein the self-test control logic is to:
  execute a first self-test of the first comparator logic in two clock cycles;
  execute a second self-test of the first comparator logic in two clock cycles;
  execute the first self-test of the second comparator logic in two clock cycles; and
  execute the second self-test of the second comparator logic in two clock cycles.

23. The system of claim 21, wherein the self-test control logic is to generate one or more control signals to:
  instruct the first comparator logic to compare the first outputs and the second outputs; and
  instruct the second comparator logic to perform a self-test of the second comparator logic.

24. The system of claim 23, wherein the one or more control signals are one or more first control signals, and the self-test control logic is to generate one or more second control signals to:
  instruct the first comparator logic to perform a self-test of the first comparator logic; and
  instruct the second comparator logic to compare fifth outputs of the first processor hardware and sixth outputs of the second processor hardware, the first processor hardware to be configured to operate in lockstep with the second processor hardware.

25. The system of claim 23, wherein:
  the first comparator logic is to:
    identify a first fault condition in response to determining that one or more of the first outputs do not match one or more of the second outputs; and
    in response to an identification of the first fault condition, transmit first lockstep debug data to a user interface, the first lockstep debug data including at least one of first port information or first program counter information associated with the first fault condition; and the second comparator logic is to:
- identify a second fault condition in response to a failure of the self-test; and
- in response to an identification of the second fault condition, transmit second lockstep debug data to the user interface, the second lockstep debug data including at least one of second port information or second program counter information associated with the second fault condition.

\* \* \* \* \*